(12) United States Patent
Ichitsubo et al.

(10) Patent No.: US 9,515,615 B2
(45) Date of Patent: Dec. 6, 2016

(54) WORLD BAND RADIO FREQUENCY FRONT END MODULE, SYSTEM AND METHOD THEREOF

(71) Applicant: Micro Mobio Corporation, Palo Alto, CA (US)

(72) Inventors: Ikuroh Ichitsubo, Sagamihara (JP); Shinsuke Inui, Yokohama (JP); Guan-Wu Wang, Palo Alto, CA (US); Weiping Wang, Palo Alto, CA (US); Zlatko Filipovic, San Jose, CA (US)

(73) Assignee: MICRO MOBIO CORPORATION, Palo Alto, CA (US)

( * ) Notice: Subject to any disclaimer, the term of this patent is extended or adjusted under 35 U.S.C. 154(b) by 0 days.

(21) Appl. No.: 14/930,632

(22) Filed: Nov. 2, 2015

(65) Prior Publication Data

US 2016/0079934 A1    Mar. 17, 2016

Related U.S. Application Data

(63) Continuation-in-part of application No. 13/918,964, filed on Jun. 16, 2013, now Pat. No. 9,178,555.

(60) Provisional application No. 61/766,889, filed on Feb. 20, 2013.

(51) Int. Cl.
| H04B 1/04 | (2006.01) |
| H03F 1/42 | (2006.01) |
| H03F 3/19 | (2006.01) |
| H03F 3/21 | (2006.01) |
| H04B 1/00 | (2006.01) |
| H04B 5/00 | (2006.01) |

(52) U.S. Cl.
CPC   *H03F 1/42* (2013.01); *H03F 3/19* (2013.01); *H03F 3/211* (2013.01); *H04B 1/006* (2013.01); *H04B 1/0067* (2013.01); *H04B 5/0037* (2013.01); *H03F 2200/451* (2013.01); *H03F 2203/21109* (2013.01)

(58) Field of Classification Search
CPC . H04B 1/04; H04B 2001/0408; H04B 1/0483; H03G 3/20; H03G 3/21; H03G 3/213
USPC ........ 455/91, 93, 127.3, 127.4; 330/51, 185, 330/192
See application file for complete search history.

(56) References Cited

U.S. PATENT DOCUMENTS

| 5,973,557 | A | 10/1999 | Miyaji et al. | |
| 8,699,974 | B2 | 4/2014 | Mo et al. | |
| 2004/0232982 | A1 | 11/2004 | Ichitsubo et al. | |
| 2009/0180403 | A1* | 7/2009 | Tudosoiu | H04B 1/006 370/278 |
| 2010/0091752 | A1* | 4/2010 | Kemmochi | H03H 7/09 370/339 |
| 2010/0291888 | A1* | 11/2010 | Hadjichristos | H03F 1/0277 455/127.4 |

(Continued)

*Primary Examiner* — Blane Jackson
(74) *Attorney, Agent, or Firm* — Roark IP

(57) ABSTRACT

The present disclosure relates to a World Band Radio Frequency Power Amplifier and a World Band Radio Frequency Front End Module. The World Band Power Amplifier can contain at least one broadband power amplifier connected to a switch which can direct an RF input signal to a plurality of transmission paths, each transmission path configured for a different frequency. The World Band RFFE Module is more integrated version of the World Band Power Amplifier that can contain broadband RF PA(s), switches, logic controls, filters, duplexers and other active and passive components.

21 Claims, 19 Drawing Sheets

(56) References Cited

U.S. PATENT DOCUMENTS

| | | |
|---|---|---|
| 2011/0222443 A1 | 9/2011 | Khlat |
| 2012/0049953 A1 | 3/2012 | Khlat |
| 2013/0051284 A1 | 2/2013 | Khlat |
| 2013/0328723 A1* | 12/2013 | Rappaport ........... H04B 1/3838 342/372 |
| 2013/0336181 A1 | 12/2013 | Khlat et al. |
| 2014/0015603 A1 | 1/2014 | Scott et al. |
| 2014/0024322 A1 | 1/2014 | Khlat |
| 2014/0169243 A1 | 6/2014 | Khlat et al. |
| 2015/0050901 A1 | 2/2015 | Lee et al. |

* cited by examiner

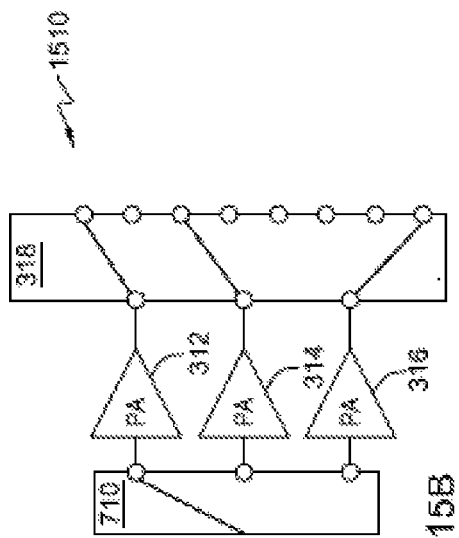
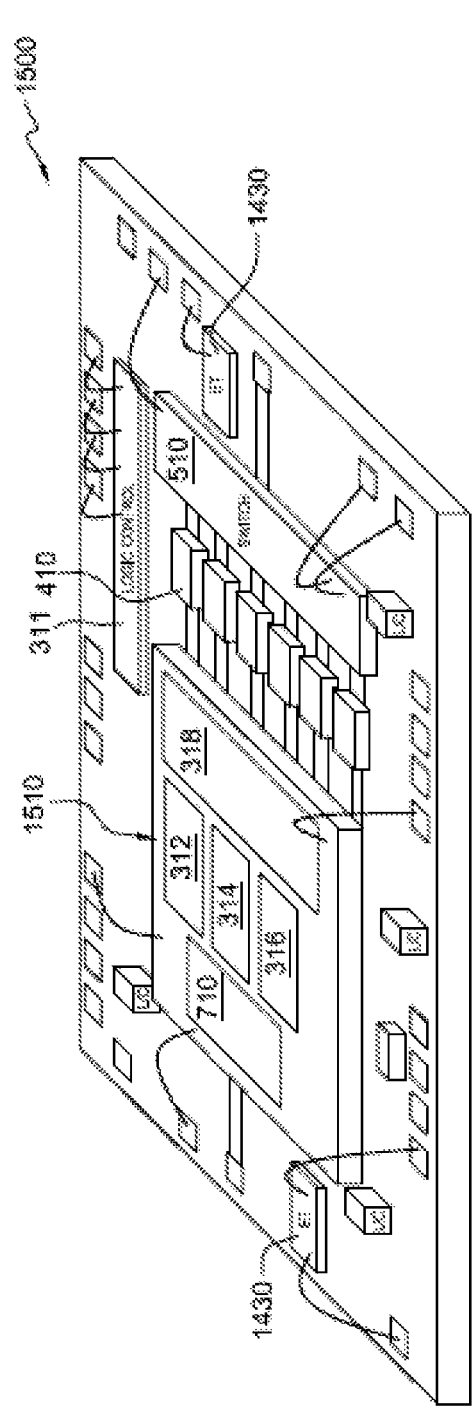
FIG. 15A
FIG. 15B

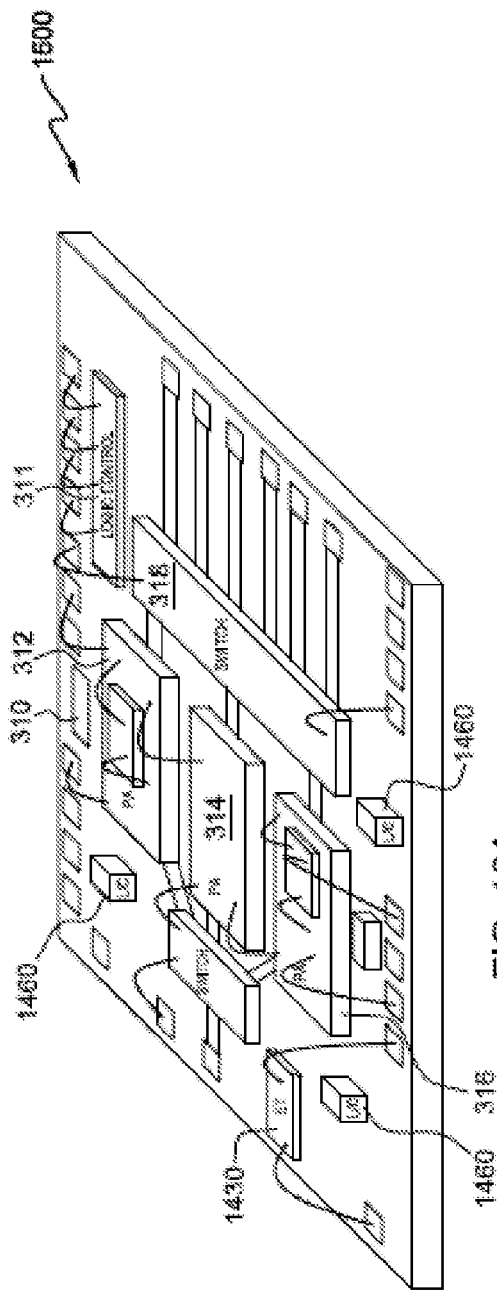
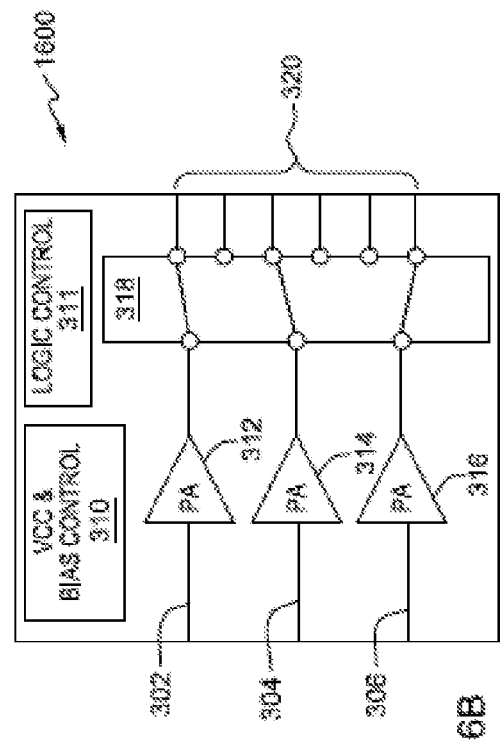
FIG. 16A
FIG. 16B

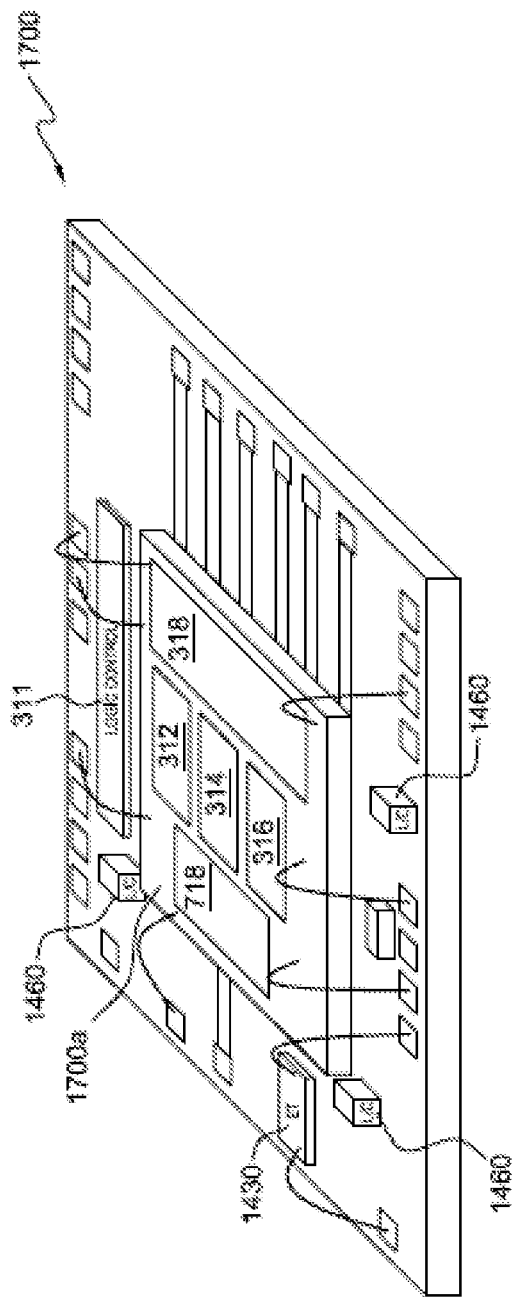
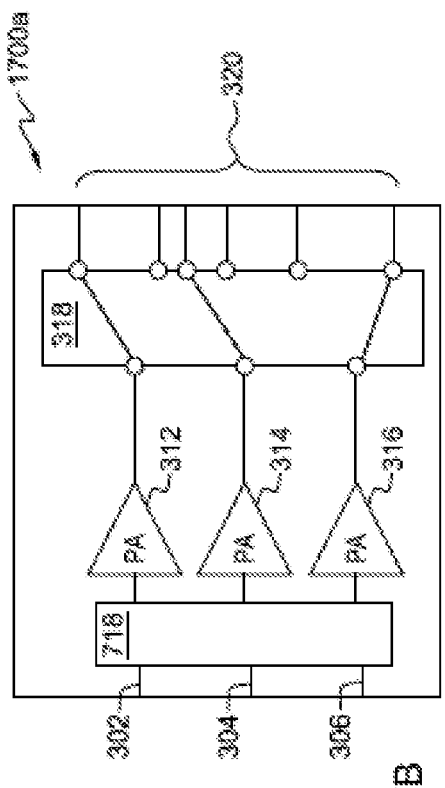
FIG. 17A
FIG. 17B

| E-UTRA Operating Band | Uplink(UL) operating band BS received UE transmit $F_{UL\_low} - F_{UL\_high}$ | Downlink(DL) operating band BS transmit UE receive $F_{DL\_low} - F_{DL\_high}$ | Duplex mode |
|---|---|---|---|
| 1 | 1920 MHz – 1980 MHz | 2110 MHz – 2170 MHz | FDD |
| 2 | 1850 MHz – 1910 MHz | 1930 MHz – 1990 MHz | FDD |
| 3 | 1710 MHz – 1785 MHz | 1805 MHz – 1880 MHz | FDD |
| 4 | 1710 MHz – 1755 MHz | 2110 MHz – 2155 MHz | FDD |
| 5 | 824 MHz – 849 MHz | 869 MHz – 894 MHz | FDD |
| 6[1] | 830 MHz – 840 MHz | 875 MHz – 885 MHz | FDD |
| 7 | 2500 MHz – 2570 MHz | 2620 MHz – 2690 MHz | FDD |
| 8 | 880 MHz – 915 MHz | 925 MHz – 960 MHz | FDD |
| 9 | 1749.9 MHz – 1784.9 MHz | 1844.9 MHz – 1879.9 MHz | FDD |
| 10 | 1710 MHz – 1770 MHz | 2110 MHz – 2170 MHz | FDD |
| 11 | 1427.9 MHz – 1447.9 MHz | 1475.9 MHz – 1495.9 MHz | FDD |
| 12 | 699 MHz – 716 MHz | 729 MHz – 746 MHz | FDD |
| 13 | 777 MHz – 787 MHz | 746 MHz – 756 MHz | FDD |
| 14 | 788 MHz – 798 MHz | 758 MHz – 768 MHz | FDD |
| 15 | Reserved | Reserved | FDD |
| 16 | Reserved | Reserved | FDD |
| 17 | 704 MHz – 716 MHz | 734 MHz – 746 MHz | FDD |
| 18 | 815 MHz – 830 MHz | 860 MHz – 875 MHz | FDD |
| 19 | 830 MHz – 845 MHz | 875 MHz – 890 MHz | FDD |
| 20 | 832 MHz – 862 MHz | 791 MHz – 821 MHz | FDD |
| 21 | 1447.9 MHz – 1462.9 MHz | 1495.9 MHz – 1510.9 MHz | FDD |
| ... | | | |
| 23 | 2000 MHz – 2020 MHz | 2180 MHz – 2200 MHz | FDD |
| 24 | 1626.5 MHz – 1660.5 MHz | 1525 MHz – 1559 MHz | FDD |
| 25 | 1850 MHz – 1915 MHz | 1930 MHz – 1995 MHz | FDD |
| ... | | | |
| 33 | 1900 MHz – 1920 MHz | 1900 MHz – 1920 MHz | FDD |
| 34 | 2010 MHz – 2025 MHz | 2010 MHz – 2025 MHz | FDD |
| 35 | 1850 MHz – 1910 MHz | 1850 MHz – 1910 MHz | FDD |
| 36 | 1930 MHz – 1990 MHz | 1930 MHz – 1990 MHz | FDD |
| 37 | 1910 MHz – 1930 MHz | 1910 MHz – 1930 MHz | FDD |
| 38 | 2570 MHz – 2620 MHz | 2570 MHz – 2620 MHz | FDD |
| 39 | 1880 MHz – 1920 MHz | 1880 MHz – 1920 MHz | FDD |
| 40 | 2300 MHz – 2400 MHz | 2300 MHz – 2400 MHz | FDD |
| 41 | 2496 MHz – 2690 MHz | 2496 MHz – 2690 MHz | FDD |
| 42 | 3400 MHz – 3600 MHz | 3400 MHz – 3600 MHz | FDD |
| 43 | 3600 MHz – 3800 MHz | 3600 MHz – 3800 MHz | FDD |
| Note 1: Band 6 is not applicable | | | |

FIG. 19

WORLD BAND RADIO FREQUENCY FRONT END MODULE, SYSTEM AND METHOD THEREOF

PRIORITY CLAIM

This application is a continuation-in-part of U.S. patent application Ser. No. 13/918,964, filed Jun. 16, 2013, which claims the benefit of U.S. Provisional Patent Application Ser. No. 61/766,889, filed Feb. 20, 2013; the aforementioned applications being incorporated by reference in their entirety for all purposes.

FIELD OF THE DISCLOSURE

The present disclosure relates generally to mobile devices and, in particular, in one or more embodiments, the present disclosure relates to amplifiers and front end modules capable of communicating in a plurality of frequency bands and accompanying methods thereof.

BACKGROUND

Radio frequency (RF) transmission of an electrical signal requires corresponding power amplification for the intended transmission. RF signals typically have a frequency spectrum that can range from several Megahertz (MHZ) to tens of Gigahertz (GHZ) and higher. A major component of the cellular phone is the RF power amplifier. A linear RF power amplifier (PA) is conventionally in the form of a semiconductor Monolithic Microwave Integrated Circuit (MMIC) and can be made using Gallium Arsenide (GaAs), Silicon Germanium (SiGe), Complementary Metal-Oxide-Semiconductor (CMOS), Silicon on Insulator (SOI) and the like. The RF PA and other active and passive components, such as baseband, transceiver, filters, switches, are typically assembled on a printed circuit board (PCB). With the proliferation and introduction of new wireless communication standards (Long Term Evolution (LTE)/Long Term Evolution-Advanced (LTE-A), Super Wi-Fi, etc.) and new communication frequency bands (B40, B41, B17, B12, etc.), wireless communication devices (phones, personal digital assistants (PDA's), tablets, laptops, and the like) must be capable of accessing wireless services through multiple standards and multiple frequency bands. In current wireless device designs that support multiple frequencies and multiple wireless standards the cost, the size and the complexity of wireless devices can be problematic.

SUMMARY

Aspects of one embodiment disclosed herein include an integrated module for use in a radio frequency (RF) front end system comprising: a broadband power amplifier configured to amplify an RF signal; and a first switch module connected to the broadband power amplifier, said first switch module containing at least one switch which is selectively operable to couple the RF signal to one of a plurality of transmission paths, each of said transmission paths configured to transmit a different frequency band.

Aspects of another embodiment include an integrated module for use in a radio frequency (RF) front end system comprising: a plurality of broadband power amplifiers each configured to amplify an RF signal; and a first switch module connected to the plurality of broadband power amplifiers, said first switch module is a multi pole, multi throw switch containing a plurality of switches which are selectively operable to couple the RF signal to one of a plurality of transmission paths, each of said transmission paths configured to transmit a different frequency band.

Aspects of another embodiment include an integrated module for use in a radio frequency (RF) front end system comprising: a first broadband power amplifier configured for saturated operation and capable of amplifying an RF signal in the 2G bands; said first broadband power amplifier connected to a first switch module, said first switch module containing at least one switch which is selectively operable to couple the RF signal to one of a plurality of transmission paths, each of said transmission paths configured to transmit a different frequency band; a second broadband power amplifier configured for linear operation and capable of amplifying an RF signal in the 3G and standard bands; and said second broadband connected to a second switch module, said second switch module containing at least one switch which is selectively operable to couple the RF signal to one of a plurality of transmission paths, each of said transmission paths configured to transmit a different frequency band.

Aspects of another embodiment include an integrated module for use in a radio frequency (RF) front end system comprising: a broadband power amplifier configured to receive and amplify signals in the 2G, 3G and 4G standards ranges; and a mode control capable of switching the broadband power amplifier between linear and saturated operation.

Aspects of another embodiment include an integrated module for use in a radio frequency (RF) front end system comprising: a broadband power amplifier capable of receiving signals in the 2G, 3G, 4G and WiFi bands; and a mode control capable of switching the power amplifier between linear and saturated mode of operation of the broadband power amplifier.

Aspects of another embodiment include an integrated module for use in a radio frequency (RF) front end system comprising: a broadband power amplifier configured to receive and amplify an RF signal in the 2G, 3G and 4G bands; said broadband power amplifier coupled to a first switch module, said first switch module containing at least one switch which is selectively operable to couple the RF signal to one of a plurality of transmission paths, each of said transmission paths configured to transmit a different frequency band; an RF power sensing circuit connected to the output of the broadband power amplifier and configured to control a power supply to the broadband power amplifier for biasing depending on the power amplifier output power level; and a mode control capable of switching the power amplifier between linear and saturated operation.

Aspects of another embodiment include a radio frequency (RF) front end system comprising: a single module comprising: at least one broadband power amplifier configured to receive and amplify an RF signal; and a first switch module connected to said at least one broadband power amplifier, said switch module containing at least one switch which is selectively operable to couple the RF signal to one of a plurality of transmission paths, each of said transmission paths configured to transmit a different frequency band; and said plurality of transmission paths coupled to a second switch module which is external to the single module, said second switch module outputting the RF signal.

BRIEF DESCRIPTION OF THE DRAWINGS

FIG. 15A is a perspective view of another embodiment of the multichip module showing broadband power amplifiers integrated with switches on the same die and filters and a switch located outside the package and FIG. 15B is a corresponding functional block diagram.

FIG. 16A is a perspective view of another embodiment of the multichip module also showing broadband power amplifiers integrated with switches on the same die and filters located outside the package and FIG. 16B is a corresponding functional block diagram.

FIG. 17A is a perspective view of another embodiment of the multichip module showing broadband power amplifiers integrated with switches on the same die and FIG. 17B is a corresponding functional block diagram.

FIG. 19 is a chart showing the evolved Universal Mobile Telecommunications System (UMTS) Terrestrial Radio Access (E-UTRA) operating bands.

DETAILED DESCRIPTION

The present disclosure provides a detailed description of a World Band RF Power Amplifier ("World Band Power Amplifier") and a World Band Radio Frequency Front End Module ("World Band RFFE Module") and accompanying methods thereof. The World Band Power Amplifier can contain at least one broadband power amplifier connected to a switch which can direct an RF input signal to a plurality of transmission paths, each transmission path configured for a different frequency. The World Band RFFE Module is more integrated version of the World Band Power Amplifier that can contain broadband RF PA(s), switches, logic controls, filters, duplexers and other active and passive components. As new wireless frequency bands and wireless standards are being introduced and are being combined with previous wireless bands in a single device, the RF complexity and cost inside mobile devices is becoming greater while the devices are becoming smaller and cheaper. Portable devices such as laptop personal computers, tablets, and cellular phones with wireless communication capability are being developed with multiple bands and multiple standards in ever decreasing size and complexity for convenience of use. Correspondingly, the electrical components thereof must also decrease in size while covering a plurality of bands and providing effective radio transmission performance. However, the substantially high RF complexity associated with wireless RF systems increases the difficulty of miniaturization of the transmission components. For example, each band supported by the communication device would require a separate RF PA and in some cases each standard would require an additional PA's which in turn raises the overall cost. The World Band Power Amplifier and World Band RFFE Module disclosed herein solves this problem by introducing broadband amplifiers that can cover multiple bands (e.g., 698 MHz to 3.8 GHz) and multiple standards (e.g., 2G, 3G, 4G, etc.) and can contain other passive and active components such as switches, filters and/or duplexers to reduce the overall size of the RF front end.

Figure 1A:
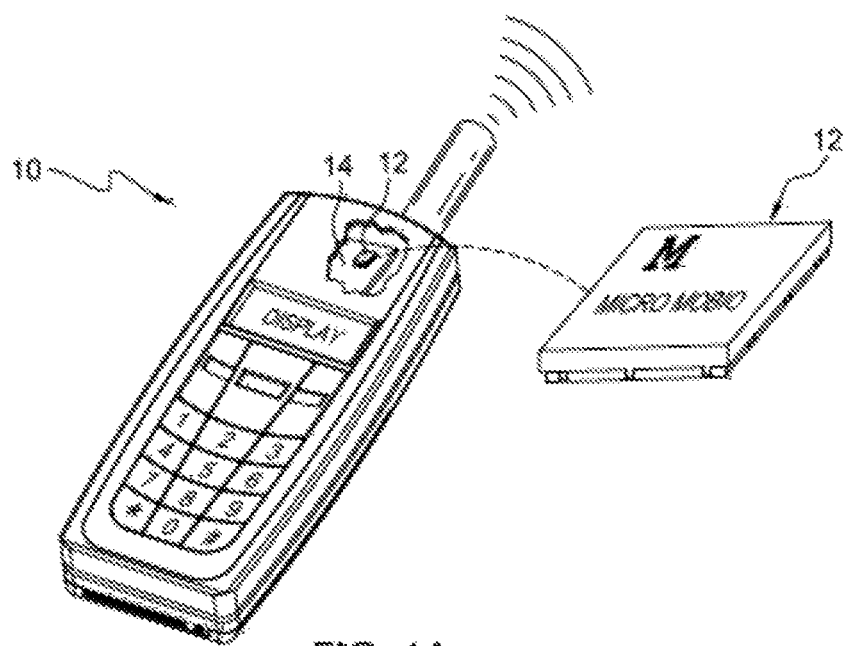
FIGS. 1A and 1B are partly schematic representations of an exemplary cellular phone (FIG. 1A) and portable wireless tablet (FIG. 1B) having World Band Amplifiers and World Band RFFE Modules in accordance with the embodiments disclosed herein.
Figure 1B:
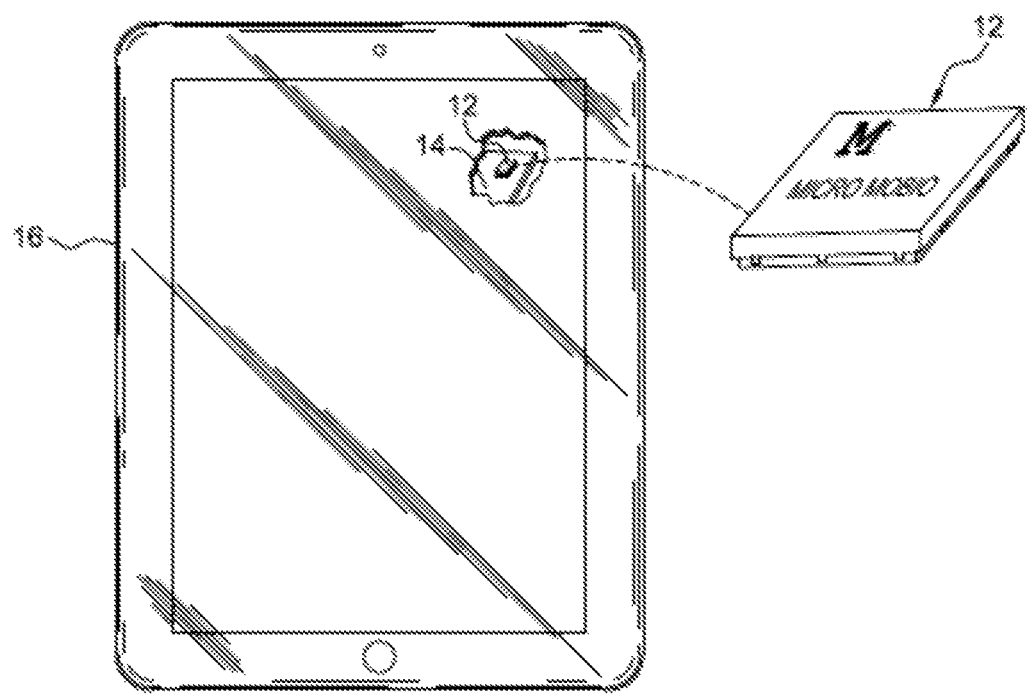

FIG. 1A is an exemplary cellular phone 10 configured for transmitting and receiving RF signals (and in some embodiments disclosed herein WiFi signals). The cellular phone includes a World Band RFFE Module 12 (or World Band Power Amplifier) mounted to a larger PCB 14 within the housing of the phone 10. FIG. 1B is an exemplary wireless electronic tablet 16 also containing a World Band RFFE Module 12 (or a World Band Power Amplifier) for transmitting and receiving RF signals (and also in some embodiments WiFi signals).

Figure 1C:
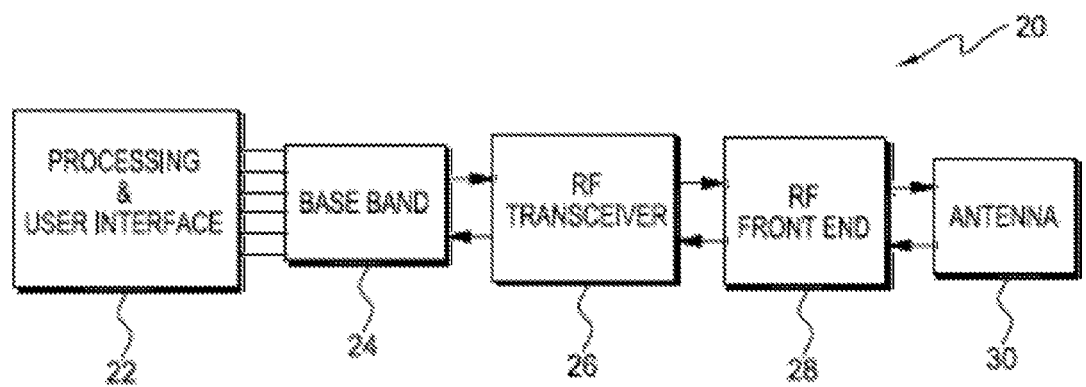
FIG. 1C is a block diagram of an exemplary wireless communication system of a mobile device showing an RF Front End containing the World Band Amplifiers or World Band RFFE Modules disclosed herein.

FIG. 1C is a block diagram of an exemplary communication device 20 containing an RFFE system 28 which includes the World Band RFFE Module (or World Band Power Amplifier). Processing & User Interface 22 is made up of a Computer Processing Unit (CPU), Application Processor, Graphics Processing Unit (GPU), Memory, LCD Drivers, Camera Sensors, Audio/Video Controller and other processing interfaces. Base Band 24 performs signal processing and real-time radio transmission operations. Multimode, multi-band RF transceiver 26 performs conversions between digital baseband and analog RF signals. RFFE 28 contains active and passive components for RF transmission/reception such as power amplifiers, filters, switches, duplexers, diplexers, low-noise amplifiers (LNAs), and others some of which are integrated into the World Band Amplifier or Word Band RFFE Module. Antenna 30 can be a multi-mode, multi-band antenna.

Figure 1D:
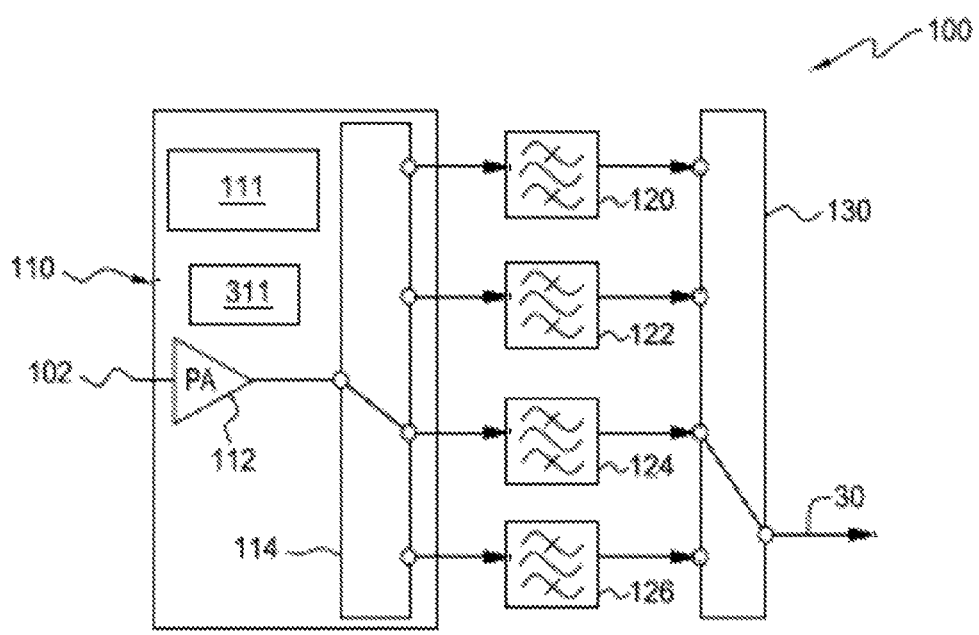
FIG. 1D is a block diagram of an exemplary portion of a front end system for a transmitter including a World Band Power Amplifier that operates in the 2.3 to 2.7 GHz range.

FIG. 1D discloses a portion of an RFFE system 100 and method for a transmitter of a communication device such as a personal digital assistant (PDA), cellular phone, a card in a laptop, wireless tablet and the like. The RFFE system 100 comprises circuitry such as amplifiers, filters, switches, duplexers, antenna tuners, advanced power tracking chips and other front end components. A portion of a front end system 100 shown in FIG. 1D includes a World Band Power Amplifier 110 and accompanying RF components that pass an RF input signal 102 (e.g., 2.3 to 2.7 GHz). The design of the World Band Power Amplifier 110 disclosed herein allows the World Band Power Amplifier 110 to transmit frequency bands (e.g., bands 38, 40, 41, and 7). The World Band Power Amplifier 110 contains a single broadband RF power amplifier 112 with RF switches 114 that can be manufactured together in a single, integrated die or as separate dies. The World Band Power Amplifier 110 may be made, for example, from GaAs, CMOS, SiGe, SOI, and other semiconductor material. An example of a broadband RF power amplifier 112 that can be used in the World Band Power Amplifier 110 is disclosed in commonly owned U.S. Pat. No. 8,253,496, issued Aug. 28, 2012, which is hereby incorporated by reference in its entirety. The other embodiments of the World Band Power Amplifier that will be disclosed in this application can be constructed in a similar manner. The switch module 114 enables selection among a series of transmission paths to filters (120, 122, 124, 126). In operation, the switching is performed in accordance with the frequency of the RF input signal to supply the amplified RF signal to the corresponding filter. Switch module 114 can be single-pole, multiple throw switch (SPnT) with "n" being the number of separate filters and hence the number of operating bands and standards that the World Band Power Amplifier 110 supports. The switch module 114 shown in FIG. 1D is a single-pole, four-throw (SP4T) RF switch, but as disclosed in other embodiments disclosed herein it may be a single-pole, eight-throw RF switch (SP8T) or it could be a multi pole, multi throw switch depending on the number of power amplifiers and operating bands. The switch module 114 can be constructed using GaAs, CMOS, Silicon on Saphire (SOS) or other materials or processes. The filters (120, 122, 124, 126) are located outside the World Band Power Amplifier 110. The filters may be surface acoustic wave (SAW) filters, bulk acoustic wave (BAW) filters or any other type of suitable filter. In operation, filter 120 may pass frequencies in the range of 2.57 to 2.62 GHz; filter 122 may pass frequencies in the range of 2.3 to 2.46 GHz; filter 124 may pass frequencies in the range of 2.496 to 2.690 GHZ; and filter 126 may pass frequencies in the range of 2.5 to 2.57 GHz. Switch module 130 can be connected to the antenna 30 (e.g., multiband antenna) for transmission. Frequency band selection can be controlled via baseband using the system 100 control pins and antenna switch control pins (not shown). While the antenna 30 may be described herein as a single antenna the embodiments may not be so limited. For example, the antenna 30 may be separate antennas dedicated to transmission and reception. Vcc & Bias Control Circuit 111 and Logic Controller 311 are incorporated into the same package as the power amplifier 112. Logic Controller 311 is used to control different features of the module 110 such as switch module 114. The controller 311 can be used to direct switch module 114 in the selection of different wireless bands. The controller 311 also controls the supply voltage, Vcc, and bias set point of Vcc & Bias Control Circuit 111 as a function of the output of the amplifier 112. The Vcc & Bias Control Circuit and Logic Controller are present throughout the World Band Power Amplifier and World Band RFFE Module embodiments disclosed herein.

Figure 1E:
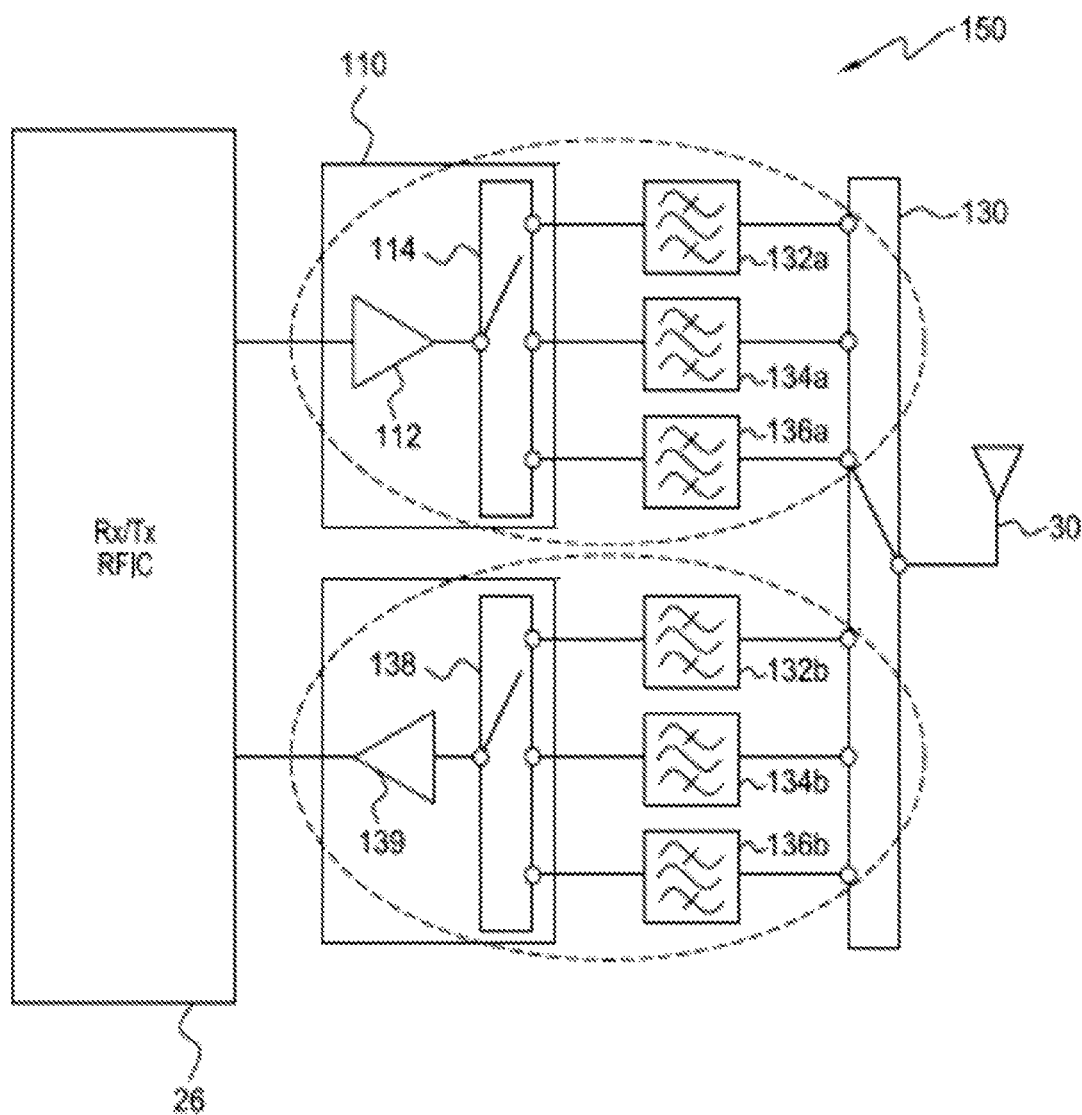
FIG. 1E is a block diagram of a portion of a front end system for a transmitter/receiver including World Band Power Amplifiers.

FIG. 1E discloses an RF front end system 150 for a transmitter/receiver of a communication system (such as a personal digital assistant (PDA), cellular phone, wireless tablet and the like). Throughout this disclosure the same reference numerals described with regard to one figure perform the same function when used in other figures. As disclosed in FIG. 1D, the disclosed front end system portions 100 and 150 are similar except that instead of filters 120, 122, 124 and 126 the duplexers 132, 134 and 136 are used. The duplexers (132a and 132b, 134a and 134b, 136a and 136b) allow bi-directional communication with the transceiver chip 26 through switch 138 and amplifier 139. The duplexers (132, 134, 136) can be, for example, frequency division duplexers (FDD). In the embodiments described throughout this description, the filters may be replaced by duplexers to transform front ends for transmitters into front ends for transmitter/receivers and vice versa.

Figure 2:
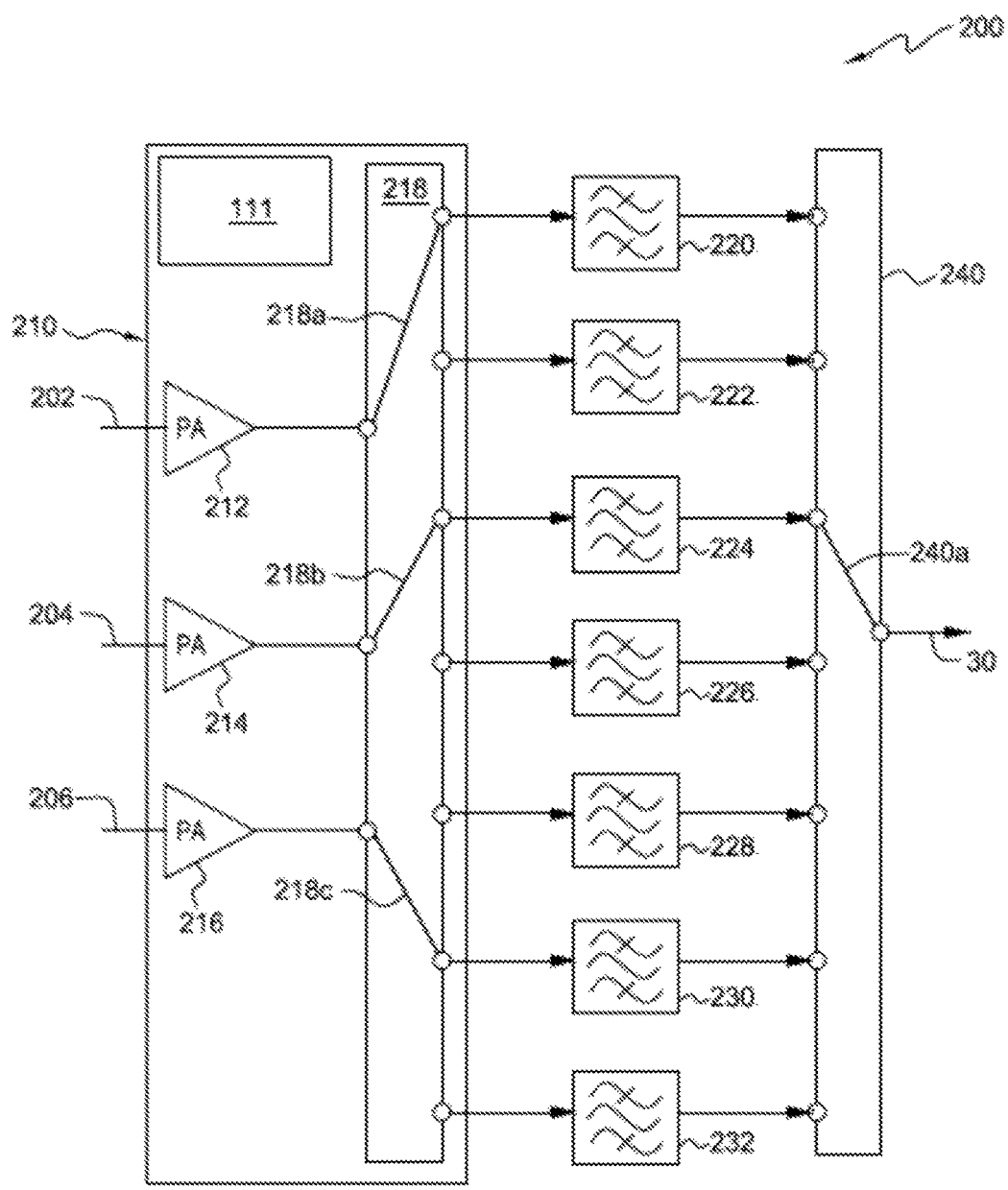
FIG. 2 is a block diagram of a portion of a front end system for a transmitter including another embodiment of the World Band Power Amplifier that operates in the 698-915 MHz, 1.7-2.1 GHz, and 2.3 to 2.7 GHz ranges.

FIG. 2 illustrates a third embodiment of a portion of a front end system 200 and method in which a larger number of bands are supported. In this embodiment, World Band Power Amplifier 210 is made up of a plurality of broadband RF power amplifiers 212, 214 and 216 having different frequencies. RF signals of a particular frequency band are sent to corresponding power amplifiers 212, 214, and 216. World Band Power Amplifier 210 also includes a switch module 218 having switches 218a, 218b, 218c which can be manufactured as a single die or as separate dies as broadband power amplifiers 212, 214, and 216. RF input 202 is in the range of 698 to 915 MHz and is directed to broadband power amplifier 212. RF input 204 is in the range of 1.7 to 2.1 GHz and is directed to broadband power amplifier 214. RF input 206 is in the range of 2.3 to 2.7 GHz and directed to broadband power amplifier 216. In operation, the amplified RF signal passes from power amplifiers 212, 214, and 216 to switch module 218. Switch module 218 is directed by controller 111 to transmit the amplified RF signals from amplifiers 212, 214 and 216 to the desired filters 220, 222, 224, 226, 228, 230 or 232. Switch 218a switches between filters 220 and 222; switch 218b switches between 224 and 226; and switch 218c switches between filters 228, 230 and 232. In this embodiment, the filters are located outside the World Band Power Amplifier 210. Switch module 240 alternatively connects the signal by switch 240a from one of the seven filters to antenna 30. As an example, this design can allow the World Band Power Amplifier 210 to cover the entire International Mobile Telecommunications (IMT) and 3GPP frequency bands (e.g. 450 MHz-3.8 GHz). In an alternative embodiment, the front end system 200 can be a transmitter/receiver and filters 220, 222, 224, 226, 228, 230 and 232 would be duplexers.

Figure 3:
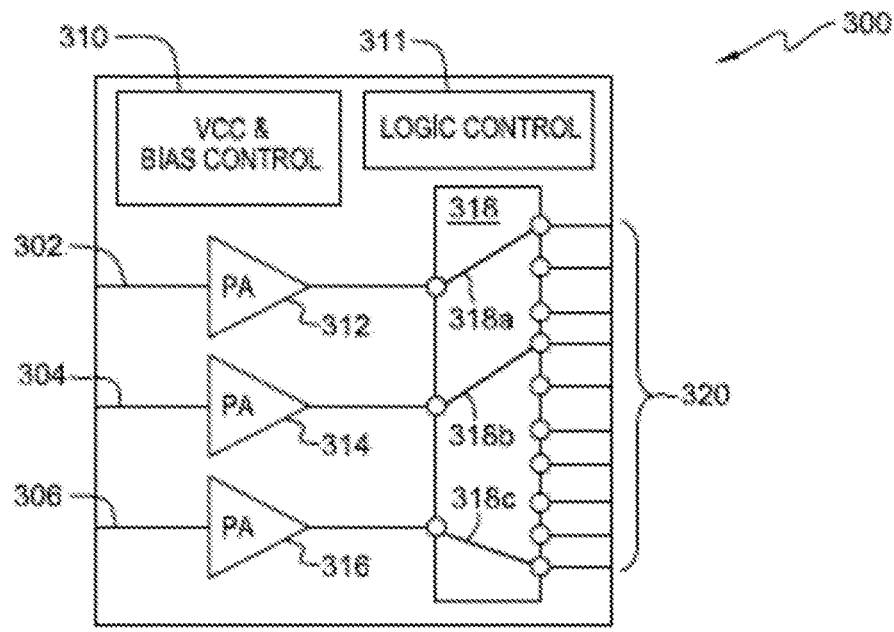
FIG. 3 is a block diagram illustrating an embodiment of the World Band Power Amplifier that operates in the 698-915 MHz, 1.7-2.1 GHz, 2.3 to 2.7 GHz and 3.3 to 3.8 GHz ranges.

FIG. 3 illustrates a fourth embodiment of the World Band Power Amplifier 300 for a front end system with a capacity for a larger number of frequency bands. World Band Power Amplifier 300 is made up of a plurality of broadband amplifiers 312, 314 and 316 with switch module 318 which can be manufactured on a single die or separate dies as the amplifiers 312, 314 and 316. RF input 302 in the range of 698 to 915 MHz is connected to broadband power amplifier 312; RF input 304 in the range of 1.7 to 2.1 GHz is connected to broadband power amplifier 314; and RF input 306 in the range of 2.3 to 2.7 GHz or 3.3 to 3.8 GHz is connected to broadband power amplifier 316. Power amplifiers 312, 314, 316 are connected to switch module 318. In this embodiment, switch module 318 (made up of switches 318a, 318b, 318c) is capable of handling "n" outputs 320 instead of 7 as disclosed in the embodiment of FIG. 2. Vcc & Bias Control Circuit 310 provides a supply voltage (from a battery or other source not shown) and bias control to the amplifiers 312, 314, and 316. In this embodiment, the Vcc & Bias Control Circuit 310 is incorporated into the same package as the power amplifiers 312, 314, and 316. Logic Controller 311 is also integrated into the same package as the power amplifiers 312, 314, and 316 and is used to control different features of the module 300 such as switch module 318. The controller 311 can be used to direct switch module 318 in the selection of different wireless bands (e.g., B1, B2). The controller 311 can also be used to select current saving modes and power boost modes. The controller 311 controls the supply voltage, Vcc, and bias set point of Vcc & Bias Control Circuit 111 as a function of the output of the amplifiers 312, 314, and 316. In an alternative embodiment, the World Band Power Amplifier 300 can be used in a transmitter/receiver front end system and configured as disclosed in FIG. 1E.

Figure 4:
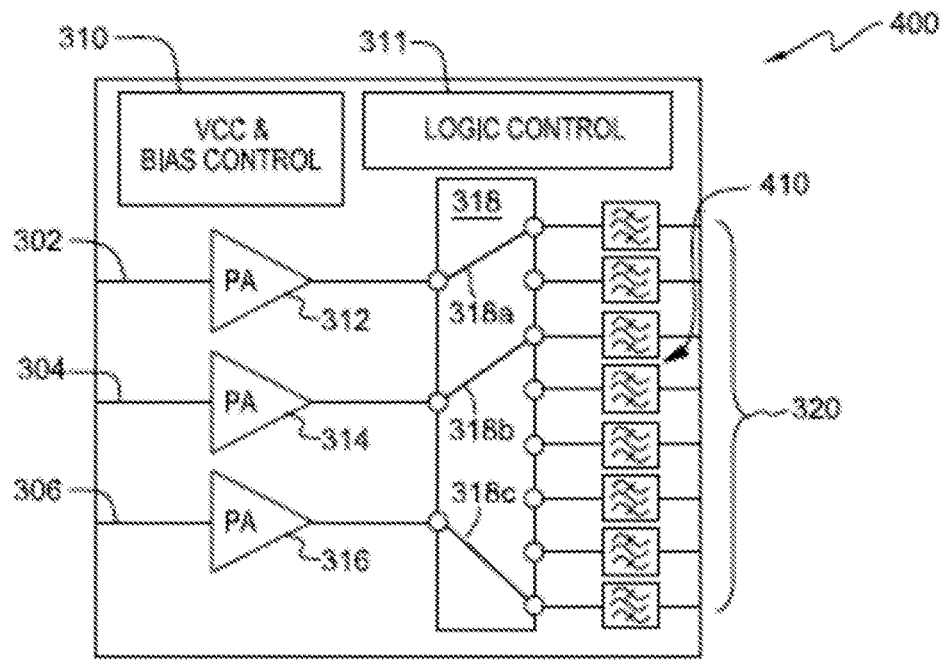
FIG. 4 is a block diagram illustrating a World Band RF Front End (RFFE) Module that operates in the 698-915 MHz, 1.7-2.1 GHz, 2.3 to 2.7 GHz and 3.3 to 3.8 GHz ranges.

FIG. 4 discloses the World Band RFFE Module 400 and method which is an enhanced version of the World Band Power Amplifier 300 of FIG. 3 which also incorporates a plurality of filters 410 which are integrated into the same package as the power amplifiers (302, 304, and 306), switch module 318, Vcc & Bias Control circuit 310 and Logic Control 311. In an alternative embodiment, the World Band RFFE Module 400 can be used in a transmitter/receiver front end system and configured as disclosed in FIG. 1E.

Figure 5:
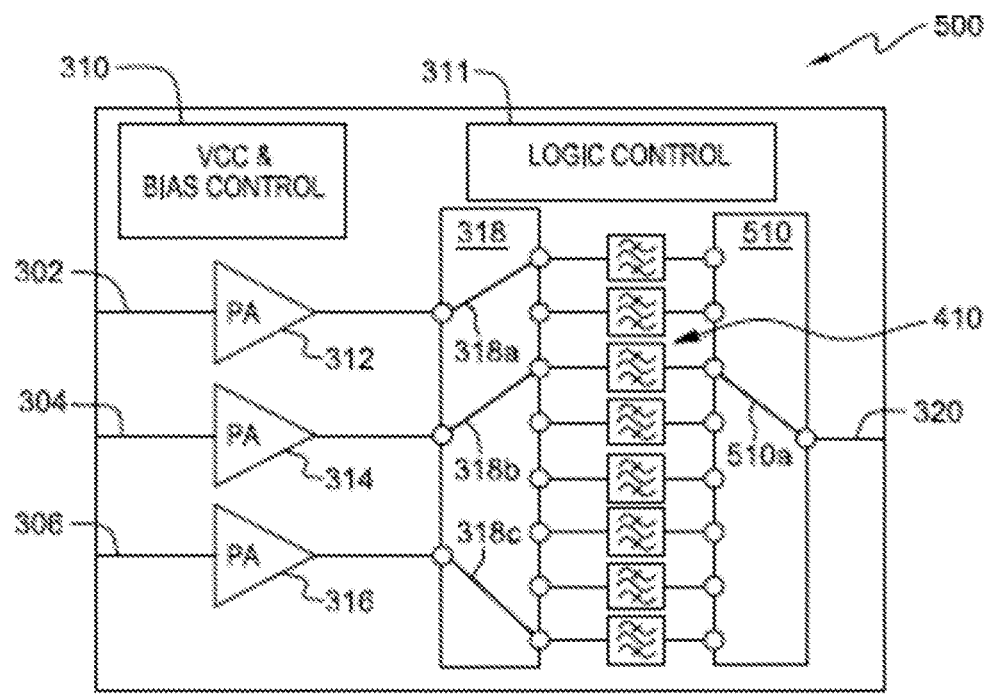
FIG. 5 is a block diagram illustrating another embodiment of the World Band RFFE Module that operates in the 698-915 MHz, 1.7-2.1 GHz, 2.3 to 2.7 GHz and 3.3 to 3.8 GHz ranges.

FIG. 5 is similar to FIG. 4 except in this embodiment the World Band RFFE Module 500 and method also includes an RF switch module 510 (with switch 510a) in the package. In an alternative embodiment, the World Band RFFE Module 500 and method can be used in a transmitter/receiver front end system and configured as disclosed in FIG. 1E.

Figure 6:
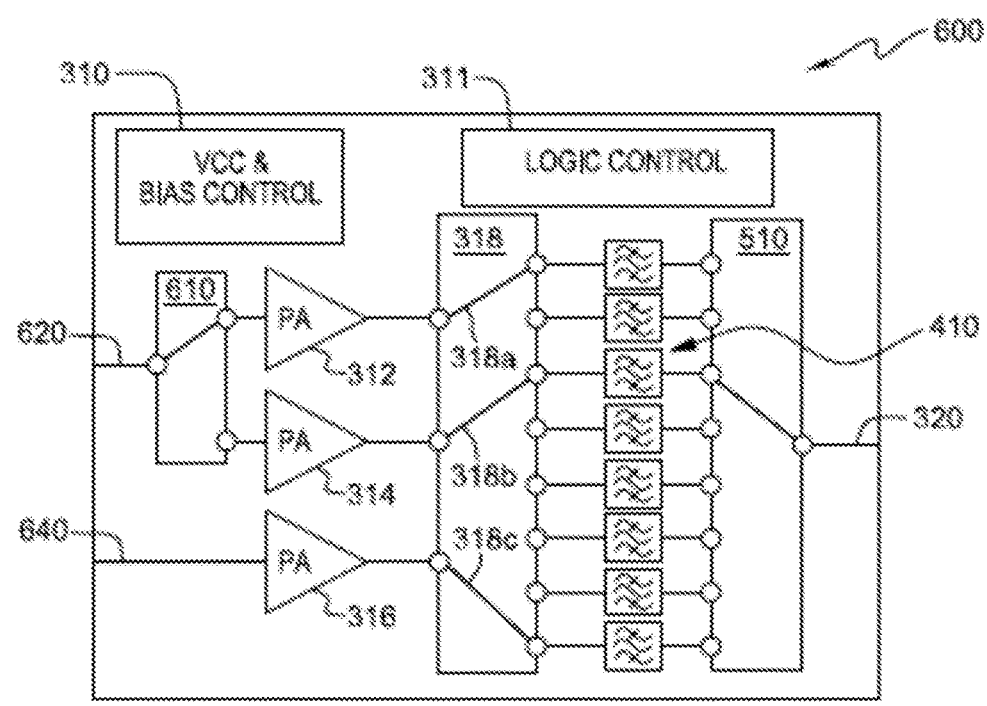
FIG. 6 is a block diagram illustrating an embodiment of the World Band RFFE Module that operates in the 698-915 MHz, 1.7-2.1 GHz, 2.3 to 2.7 GHz and 3.3 to 3.8 GHz ranges.

FIG. 6 is an embodiment of the World Band RFFE Module 600 and method which has an RF switch 610 included which switches the RF input 620 between broadband power amplifiers 312 and 314. RF input 620 may be in the range of 698 to 915 MHz or the range of 1.7 to 2.1 GHz. RF input 640 is in the range of 2.3 to 2.7 GHz or 3.3 to 3.8 GHz and is directed to power amplifier 316. In an alternative embodiment, the World Band RFFE Module 600 can be used in a transmitter/receiver front end system and configured as disclosed in FIG. 1E.

Figure 7:
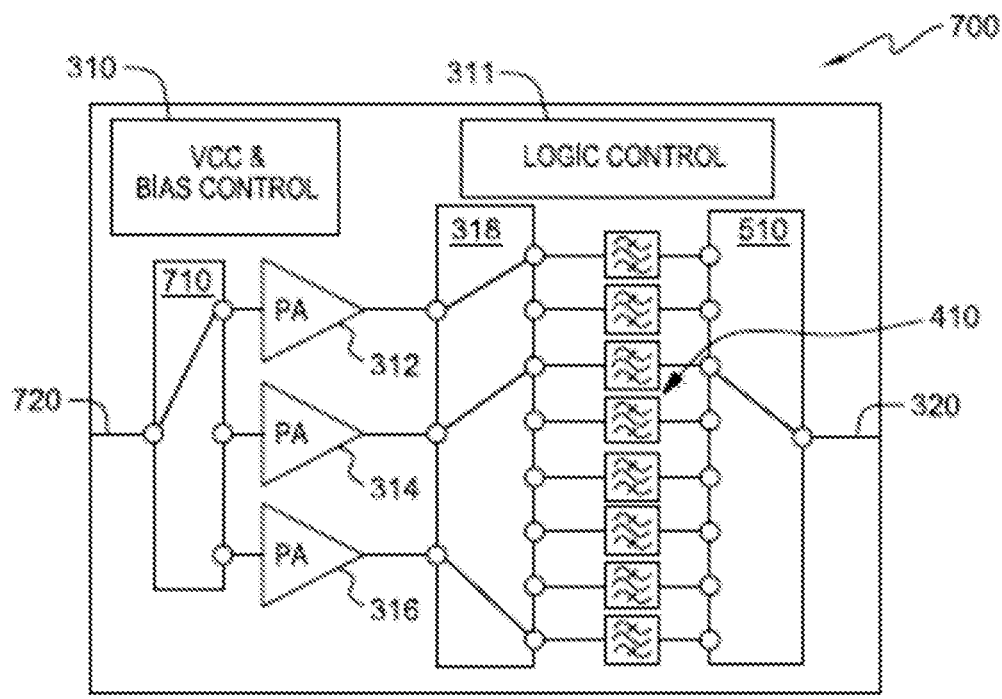
FIG. 7 is a block diagram illustrating an embodiment of the World Band RFFE Module that operates in the 698-915 MHz, 1.7-2.1 GHz, 2.3 to 2.7 GHz and 3.3 to 3.8 GHz ranges.

FIG. 7 discloses World Band RFFE Module 700 and method which includes an RF switch 710 which accepts an RF input 720 and directs the transmission to the appropriate power amplifier (312, 314, 316). RF input 720 is in the range of 698 to 915 MHz; 1.7 to 2.1 GHz; 2.3 to 2.7 GHz; or 3.3 to 3.8 GHz. As a result, the RF output 320 to the antenna can be in the range of 698 MHz to 3.8 GHz. In an alternative embodiment, the World Band RFFE Module 700 can be used in a transmitter/receiver front end system and configured as disclosed in FIG. 1E.

Figure 8:
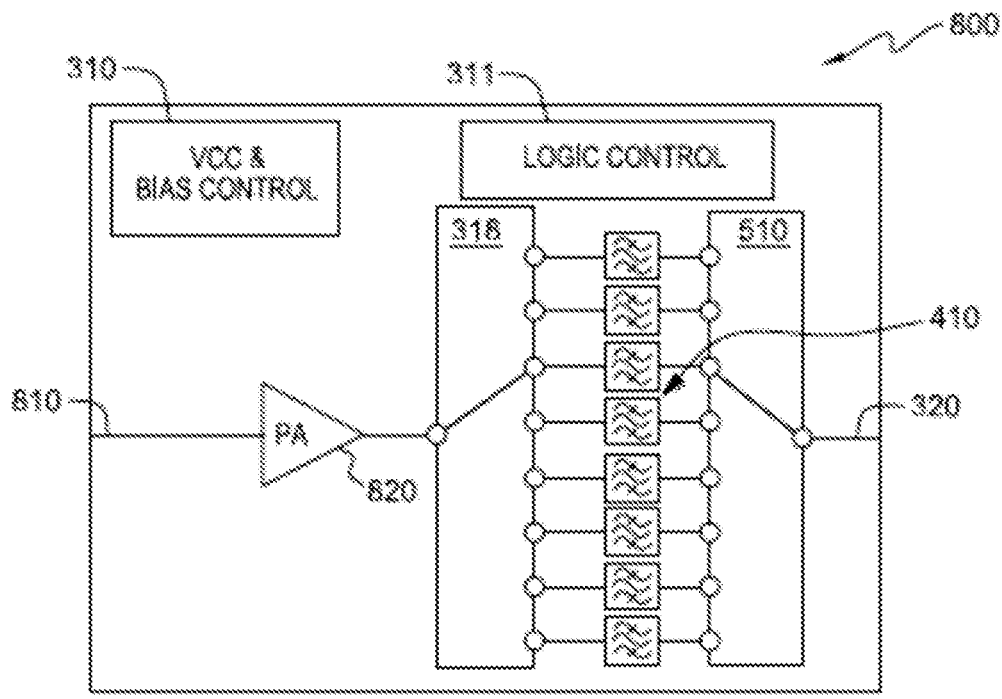
FIG. 8 is a block diagram illustrating an embodiment of the World Band RFFE Module that operates in the 698-915 MHz, 1.7-2.1 GHz, 2.3 to 2.7 GHz and 3.3 to 3.8 GHz ranges.

FIG. 8 discloses World Band RFFE Module 800 and method which accepts RF input 810 and directs the transmission to the broadband power amplifier 820. RF input 810 may be in the range of 400 MHz to 700 MHz, 698 to 915 MHz; 1.7 to 2.1 GHz; 2.3 to 7.2 GHz; or 3.3 to 3.8 GHz. Switch 318 passes the amplified RF signal to one of eight filters 410. As a result, the RF output 320 to the antenna can be in the range of 698 MHz to 3.8 GHz. In an alternative embodiment, the World Band RFFE Module 800 can be used in a transmitter/receiver front end system and configured as disclosed in FIG. 1E.

Figure 9:
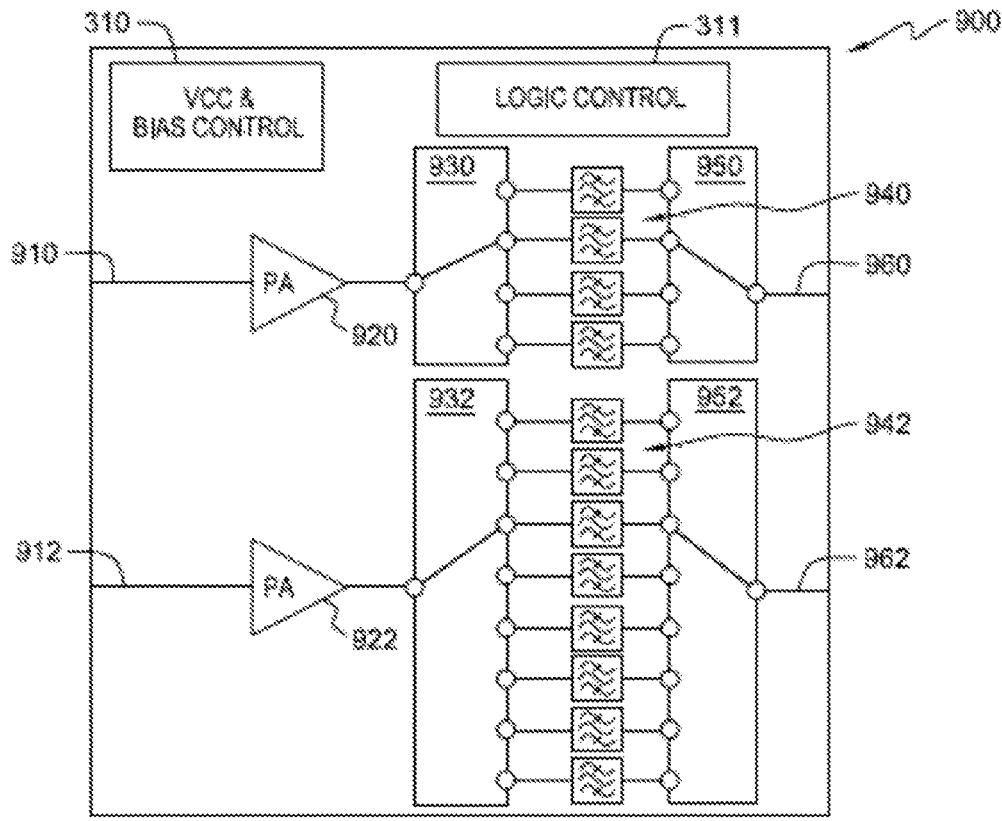
FIG. 9 is a block diagram illustrating an embodiment of the World Band RFFE Module with two separate paths for linear and saturated operation.

FIG. 9 discloses World Band RFFE Module 900 and method in which there are two separate RF paths for linear and saturated operation to support different modulation standards in the communication device. RF input 910 is connected to broadband power amplifier 920 for saturated operation (e.g., 2G Bands). In saturated operation, the amplified signal is transmitted through RF switch 930, filters 940, RF switch 950 to RF output 960 to an antenna around frequencies 850 MHz, 900 MHz, 1.8 GHz, 1.9 GHz. RF input 912 is connected to broadband power amplifier 922 for linear operation (e.g., 3G, 4G Bands). In linear operation, the amplified signal is transmitted through RF switch 932, filters 942, RF switch 952 to RF output 962 to an antenna in the range of 698 to 3800 GHz. In an alternative embodiment, the World Band RFFE Module 900 can be used in a transmitter/receiver front end system and configured as disclosed in FIG. 1E.

Figure 10:
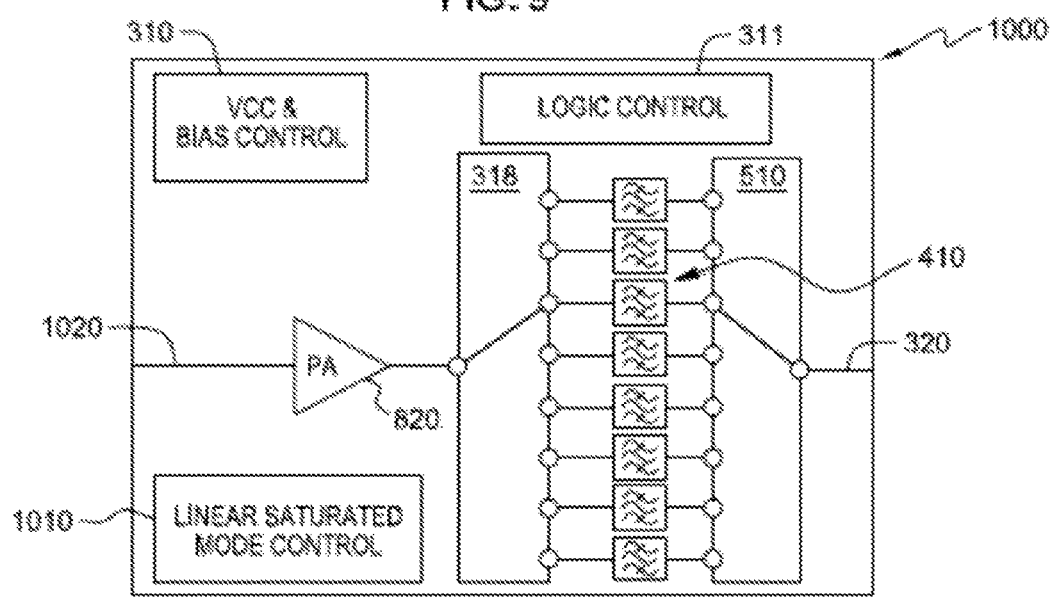
FIG. 10 is a block diagram illustrating an embodiment of the World Band RFFE Module which features mode control for linear and saturated operation.

FIG. 10 discloses World Band RFFE Module 1000 and method to which there has been added a linear and saturation mode control 1010 which operates the power amplifier 820 in the appropriate mode depending on the RF input 1020. Reference numeral 1020 indicates an RF input in the range of 698 to 915 MHz; 1.7 to 2.1 GHz; 2.3 to 7.2 GHz; or 3.3 to 3.8 GHz. In an alternative embodiment, the World Band RFFE Module 1000 can be used in a transmitter/receiver front end system and configured as disclosed in FIG. 1E.

Figure 11:
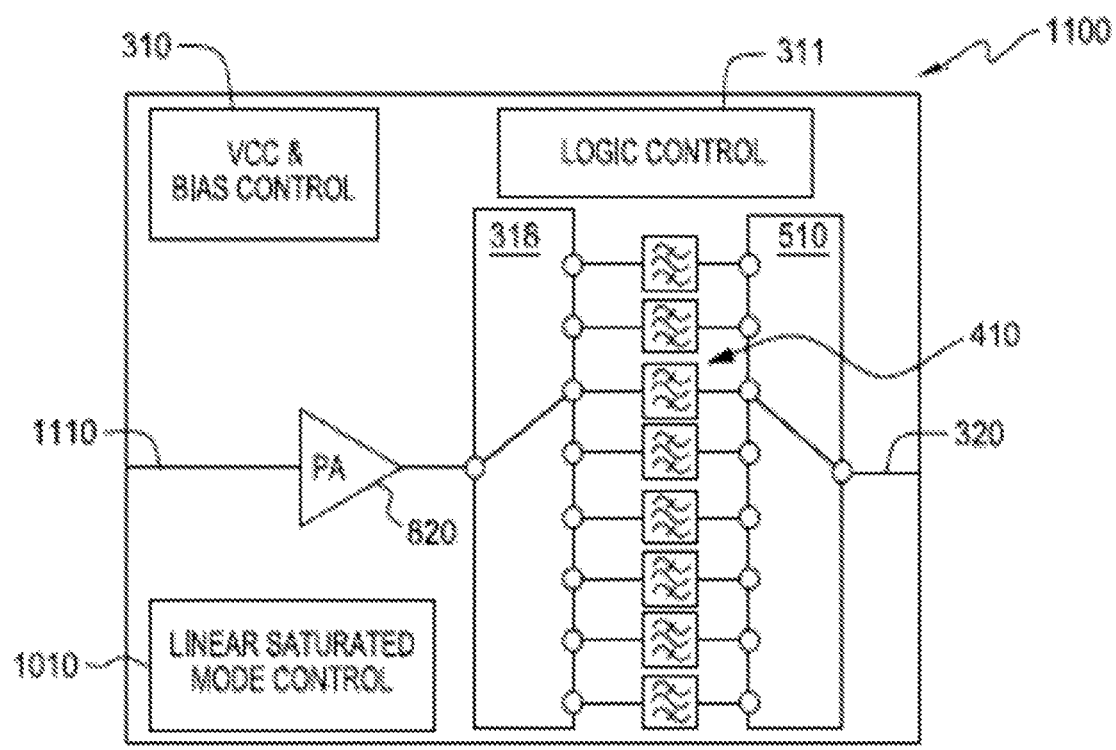
FIG. 11 is a block diagram illustrating an embodiment of the World Band RFFE Module which allows for WiFi operation.

FIG. 11 discloses World Band RFFE Module 1100 and method in which the linear saturate mode control 1010 can direct the power amplifier 820 to process RF Input 1110 in the range of 698 to 915 MHz; 1.7 to 2.1 GHz; 2.3 to 7.2 GHz; or 3.3 to 3.8 GHz as well as a WiFi standard signal input. In an alternative embodiment, the World Band RFFE Module 1100 can be used in a transmitter/receiver front end system and configured as disclosed in FIG. 1E.

Figure 12A:
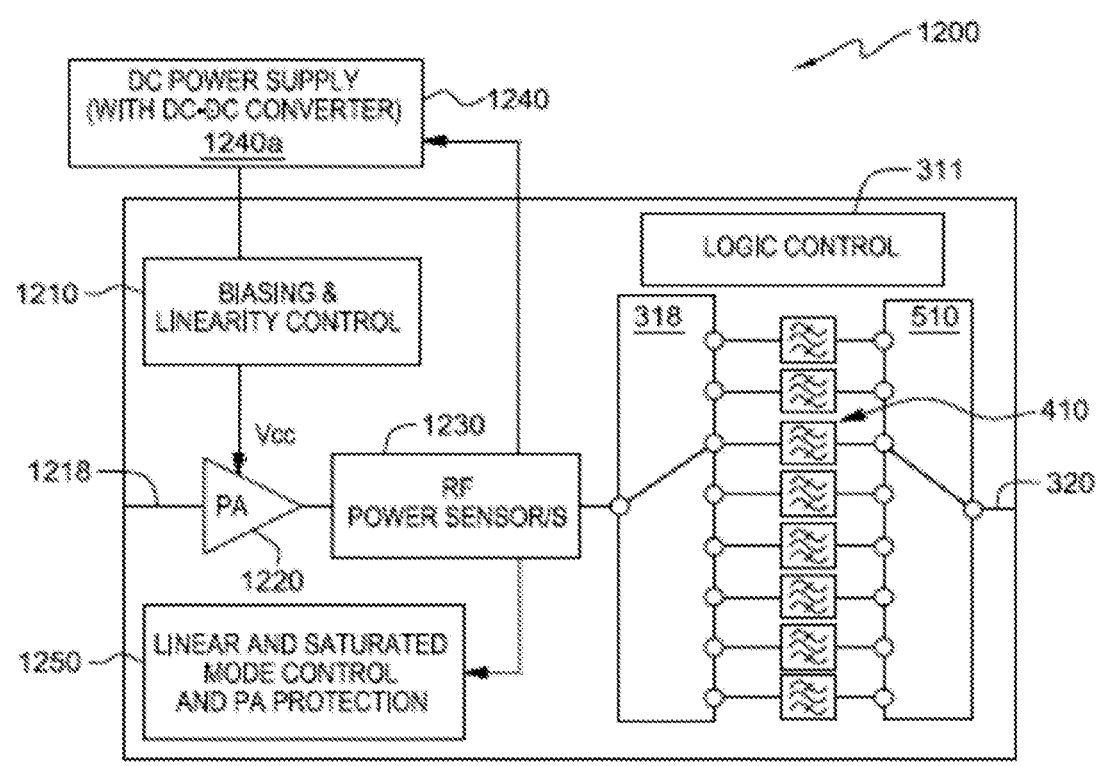
FIGS. 12A and 12B are block diagrams illustrating an embodiment of the World Band RFFE Module which contains biasing and linearity control of a broadband power amplifier.
Figure 12B:
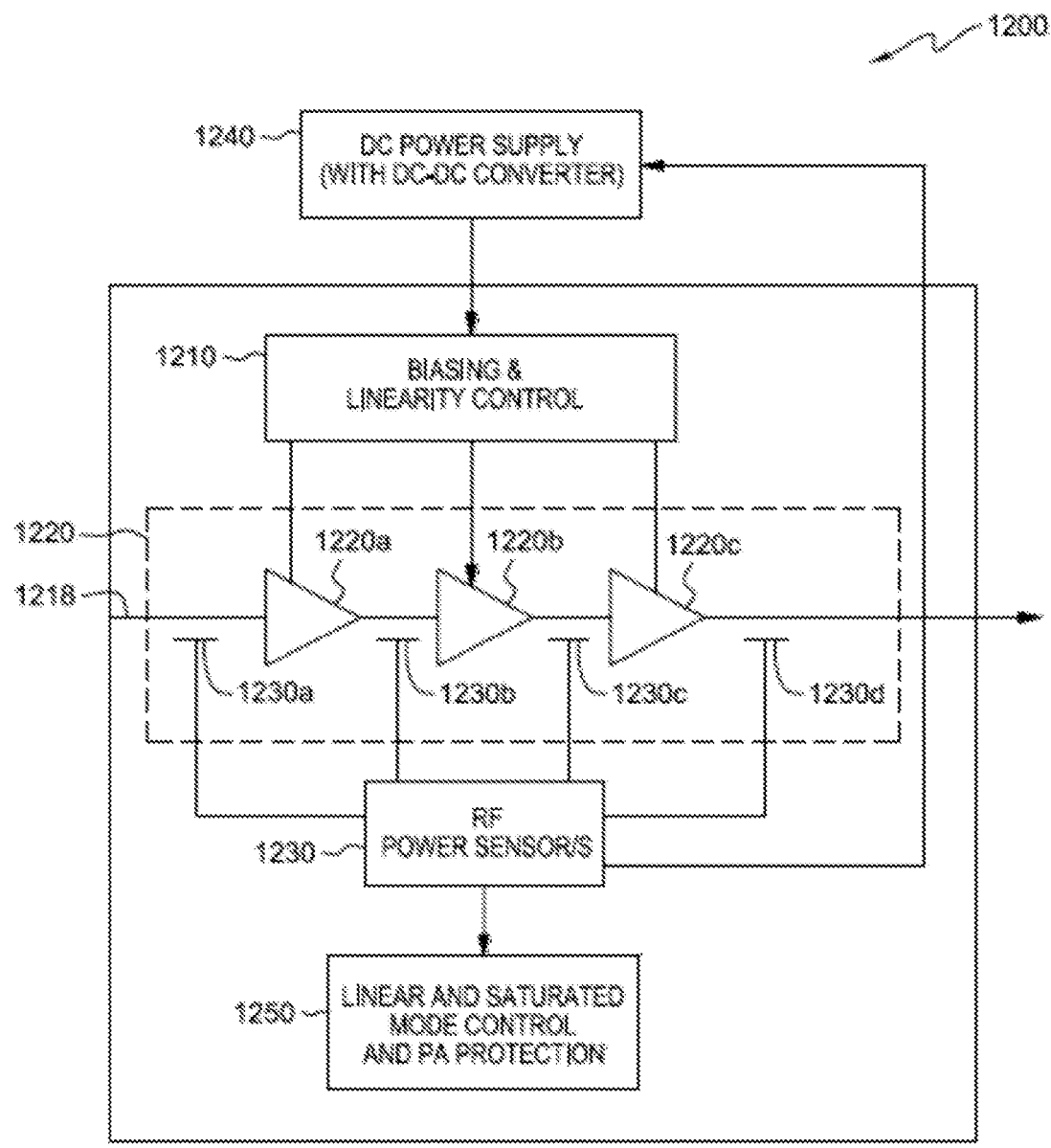

FIG. 12A discloses a World Band RFFE Module 1200 and method including power amplifier control with power sensor(s). World Band RFFE Module 1200 contains biasing and linearity control 1210 that controls the biasing voltage (Vcc) of the broadband power amplifier 1220. The World Band RFFE Module 1200 can also contain an RF power sensing circuit, shown as RF Power Sensor module 1230, which measures the RF output of the broadband power amplifier 1220. The output of the RF power sensor 1230 is used to control the DC power supply voltage from power supply 1240 (e.g., battery) for power amplifier biasing depending on power amplifier output power level. In alternative embodiments, the RF Power Sensor module 1230 can also have a plurality of power sensors. The broadband power amplifier may be made up of amplifiers 1220*a*, 1220*b* and 1220*c* and power sensors 1230*a*, 1230*b*, 1230*c*, 1230*d* can be located at any stage of the broadband power amplifier 1220 as disclosed in FIG. 12B. The power sensor(s) 1230*a*, 1230*b*, 1230*c*, 1230*d* could be dual, bi-directional power sensors that can sense forwarded or reflected power. Reflected power sensing by the power sensor 1230 can be used to detect adverse antenna condition such as high voltage standing wave ratio (VSWR) thereby reducing the output power of the power amplifier 1220 or biasing to protect the power amplifier. The DC power supply 1240 voltage output is automatically adjusted to control power amplifier biasing voltage based on the output of the RF power sensor 1230. The DC power supply 1240 may include a DC/DC converter 1240*a* to provide increased DC bias voltage supply for the power amplifier. High biasing voltage is used when the power amplifier is operating in high power level and low biasing voltage is used when the power amplifier 1220 is operating in low power level. The RF power sensor 1230 can also be used to provide linearity control in high power level output situations. For example, in the linear mode operation, when the output of the power amplifier is high, the Vcc voltage can be suitably increased to avoid power amplifier operating into non-linear saturation state. Structurally, the DC/DC converter 1240*a* can be integrated inside the World Band RFFE Module 1200 or can be a device external to the World Band RFFE Module 1200. Reference numeral 1250 indicates a circuit which can have linear and saturated mode control and power amplifier protection circuit. In an alternative embodiment, the World Band RFFE Module 1200 can be used in a transmitter/receiver front end system and configured as disclosed in FIG. 1E.

Figure 13:
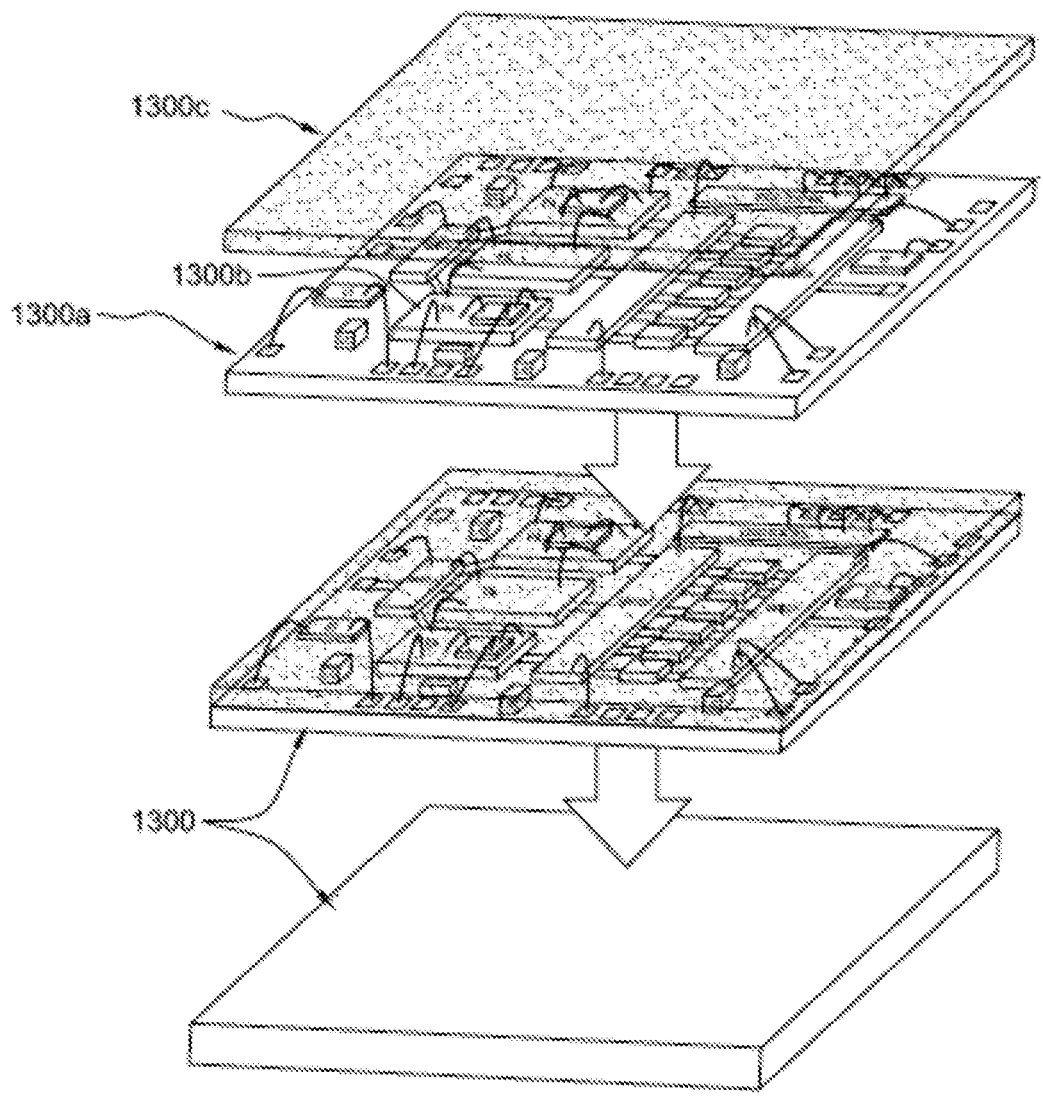
FIG. 13 is an exploded view of a multichip module which illustrates a typical construction of a World Band RFFE Module.
Figure 14A:
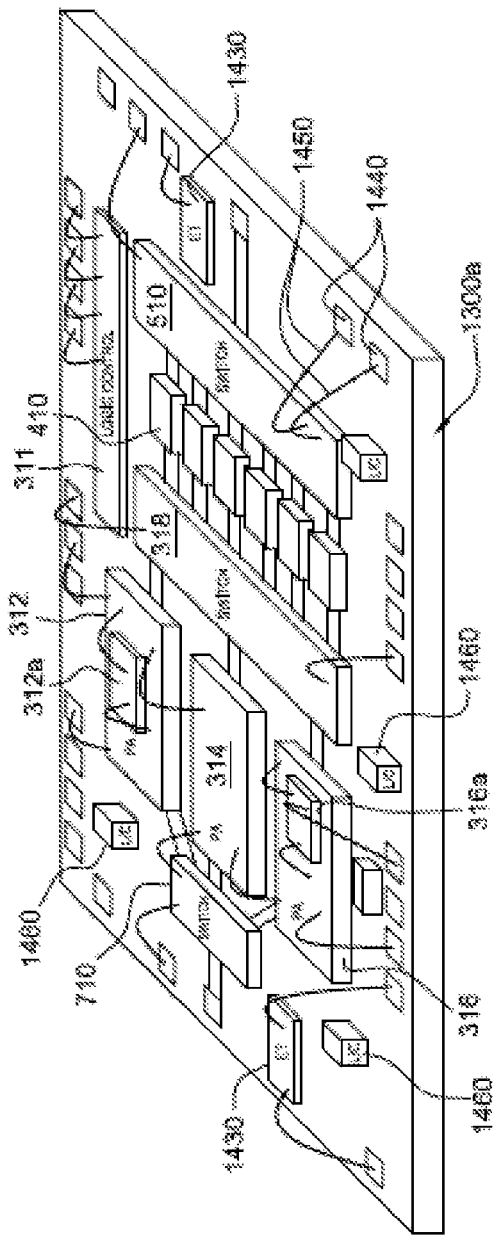
FIG. 14A is a perspective view of the multichip module showing stacked broadband power amplifiers and FIG. 14B is a corresponding functional block diagram.
Figure 14B:
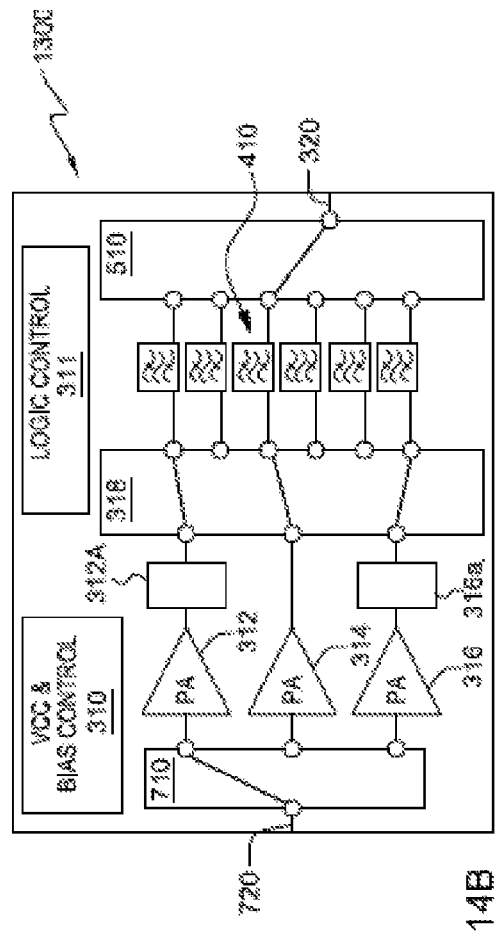

FIG. 13 is an exploded view of a multichip module 1300 that contains multiple dies in a single package such as power amplifiers, switches, filters, duplexers, CMOS controllers, envelope tracking and other circuits and devices. The multichip module 1300 and method demonstrates how the World Band Power Amplifiers and World Band RFFE Modules disclosed in FIGS. 1A-12B may be constructed. Packaged multi chip module 1300 is made up of a multi die carrier 1300*a* which has multiple active and passive components 1300*b* covered by plastic molding 1300*c*. Die carrier 1300*a* can be a low temperature co-fired ceramic (LTCC), high temperature co-fired ceramic (HTCC), printed circuit board (PCB), or the like. The active and passive components can also be embedded in the LTCC, HTCC or similar material which is covered with the plastic molding 1300*c*. FIG. 14A is a more detailed view of the die carrier 1300*a* and components 1300*b*. As discussed above, the broadband power amplifiers 312, 314, 316 can cover multiple bands in a single module 1300. The power amplifiers can be made using Silicon on Insulator (SOI), GaAs, CMOS, SiGe, and similar processes. In front end systems, it is desirable to reduce the size on required on the PCB to mount all the components needed to implement the front end system. Therefore, the power amplifiers 312, 314, and 316 can be single stacked (e.g., 314) or multi-stacked modules (e.g., 312 and 312*a*, 316 and 316*a*). The multi-stacked modules can be made up a of a power amplifier module and a second module electrically coupled to the power amplifier module via bond wires or through via holes. The second module 312*a* could be, for example, an impedance matching network or the power sensing circuit 1230 discussed with reference to FIGS. 12A and 12B or some other type of circuit. In construction, the multi-stacked modules can be, for example, CMOS stacked on top of GaAs or CMOS on top of CMOS. Stacking may be used to make the power amplifiers smaller and bond wires longer for impedance matching purposes. Reference numerals 1430 indicate envelope tracking controllers which ensure that the power amplifiers 312, 314, and 316 are operating at peak efficiency for the given instantaneous output power requirements. The envelope tracking controllers 1430 are shown in FIG. 14A located inside multichip module 1300, but they may also be located exterior to the package 1300. Filters 410 can also be located inside the module or outside the module 1300. The filters 410 can be made using bulk acoustic wave (BAW) manufacturing processes, Surface Acoustic Wave (SAW) manufacturing processes, or other similar methods. Reference numerals 1440 are examples of bond pads with bonding wires 1450 (which are located throughout the package 1300) connected to the components. Reference numerals 1460 identify LC circuits utilized throughout the package 1300. FIG. 14B is a corresponding functional block diagram of the package 1300 of FIG. 14A.

FIG. 15A is a perspective view of multichip module 1500. In this package 1500, single die 1510 integrates the power amplifiers 312, 314, and 316 and switches 710 and 318. The die 1510 may be made of GaAs, SiGe, CMOS or other semiconductor material. The power amplifiers 312, 314 and 316 are substantially planar in this embodiment without stacked circuitry. FIG. 15B is a corresponding functional block diagram of the die 1510 of FIG. 15A.

FIG. 16A is a perspective view of multichip module 1600. In the embodiment, filters and/or duplexers are located exterior to the package 1600. Also, power amplifiers 312, 314, and 316 and switch 318 are on separate dies. FIG. 16B is a corresponding functional block diagram to the package 1300 of FIG. 16A.

FIG. 17A is a perspective view of multichip module 1700. In this embodiment, power amplifiers 312, 314, and 316 and switches 318 and 718 are integrated on the same die 1700*a*. Filters and/or duplexers are located outside the package 1700. FIG. 17B is a corresponding functional block diagram to the package 1700 of FIG. 17A.

Figure 18A:
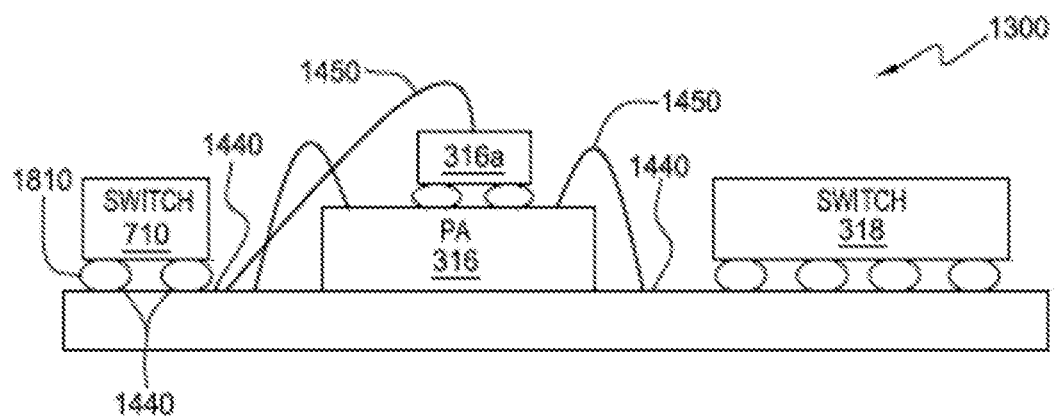
FIG. 18A is a side view of the multichip module of FIG. 14A
Figure 18B:
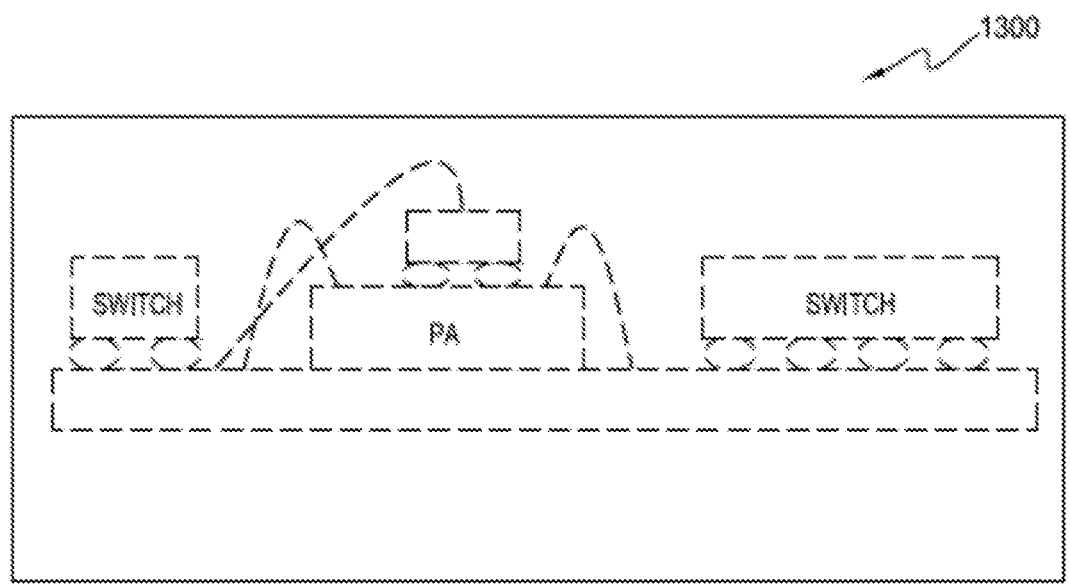
FIG. 18B is a corresponding side view of the encapsulated multichip module.

FIG. 18A is a side view of multichip module 1300. To assemble the multichip module 1300 for the World Band RFFE Module as disclosed herein both flip-chip processes along with wire bond processes can be used. Wire bonds 1450 are used to adjust inductance and other RF properties. Wire bond assembly by means of bond wire connection to the bond pads 1440. In this embodiment, switches 710 and 318 are flip chips and can be soldered 1810 to the bond pads 1440. The multichip module includes both solder bonds and wire bonds in the same package. FIG. 18B is a side view of the fully assembled chip with multichip module 1300 encapsulated in plastic.

FIG. 19 is a table of E-UTRA operating bands listing the specified frequency bands of 3GPP LTE. Each of the embodiments of the World Band Power Amplifier and World Band RFFE Module disclosed herein in FIG. 1A through FIG. 18B may be configured to operate in any subset or all of the bands listed in the table of FIG. 19 as well as any future bands that become available.

Figure 20:
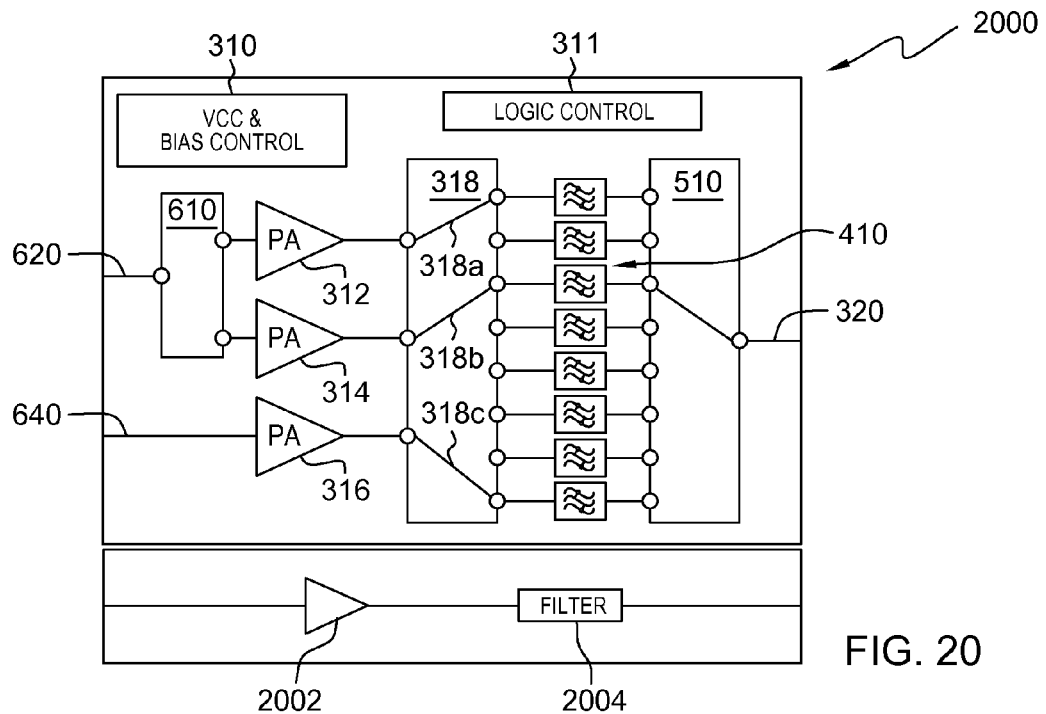
FIG. 20 is a schematic diagram of World Band RFFE Module 2000 which is a module including all the elements of FIG. 6 (see discussion in Paragraph 41 regarding FIG. 6) but also includes a power amplifier array 2002 and a filter array 2004.

FIG. 20 is a schematic diagram of World Band RFFE Module 2000 which is a module including all the elements of FIG. 6 (see discussion in Paragraph 41 regarding FIG. 6) but also includes one or an array of power amplifier(s) 2002. The term "array" here shall mean two or more power amplifiers in the same frequency band. Power amplifier array 2002 may operate in the ranges of be any one of the following high frequency bands: a 5 GHz band operating substantially in the range of 4.9 GHz to 6 GHz; a 28 GHz band operating substantially in the range of 27 GHz to 29 GHz; and a 39 GHz band operating substantially in the range of 38 GHz to 40 GHz. Filter 2004 is chosen to pass signals in the range of 4.9 GHz to 6 GHz, a 27 GHz to 29 GHz, or 38 GHz to 40 GHz corresponding to the designated power amplifier 2002. One or an array of filter(s) 2004 can be located after the power amplifier 2002 (as shown in FIG. 20) or placed before the power amplifier 2002 (not shown) to reject unwanted frequencies.

Figure 21:
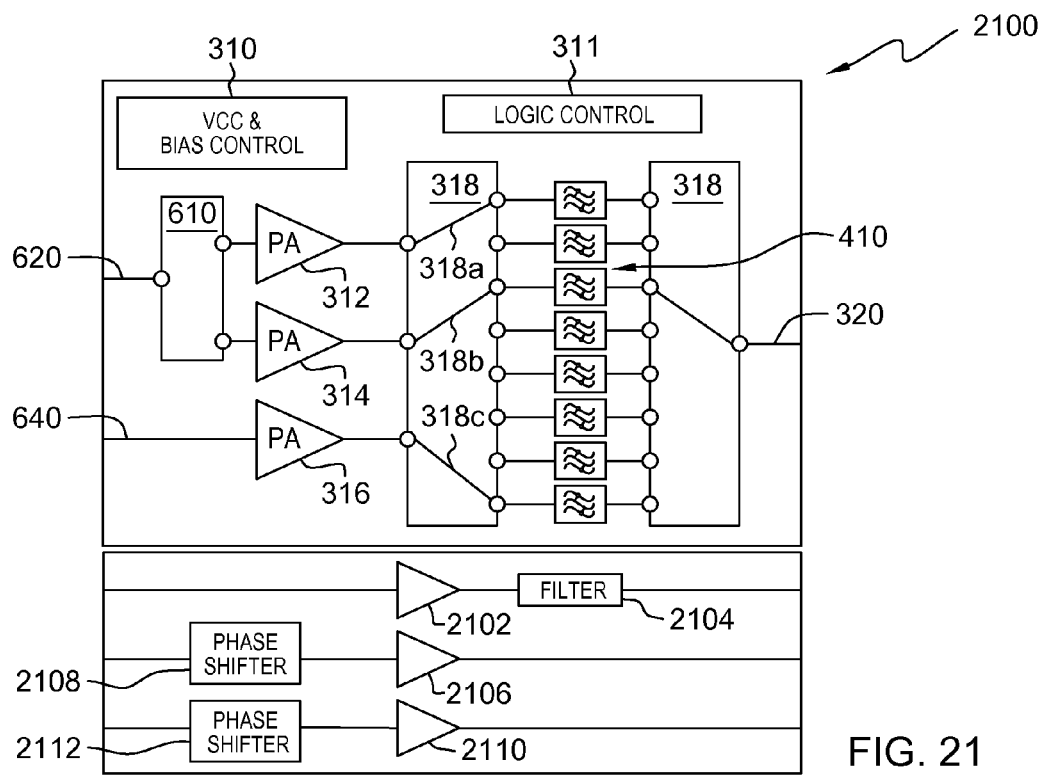
FIG. 21 is a schematic diagram of World Band RFFE Module 2100 which is a module including all the elements of FIG. 6 (see discussion in Paragraph 41 regarding FIG. 6) but also includes in the power amplifier array 2102 which is a 5 GHz band operating substantially in the range of 4.9 GHz to 6 GHz having corresponding filter array 2104; power amplifier array 2106 which is a 28 GHz band operating substantially in the range of 27 GHz to 29 GHz and having corresponding phase shifter array 2108; and power amplifier array 2110 which is a 39 GHz band operating substantially in the range of 38 GHz to 40 GHz and corresponding phase shifter array 2112.

FIG. 21 is a schematic diagram of World Band RFFE Module 2100 which is a module including all the elements of FIG. 6 (see discussion in Paragraph 41 regarding FIG. 6) but also includes one or an array of power amplifier(s) 2102 which is 5 GHz band operating substantially in the range of 4.9 GHz to 6 GHz having at least one or an array of corresponding filter(s) 2104; one or an array of power amplifier(s) 2106 which is 28 GHz band operating substantially in the range of 27 GHz to 29 GHz and having at least one or an array of corresponding phase shifter(s) 2108; and one or an array of power amplifier(s) 2110 which is a 39 GHz band operating substantially in the range of 38 GHz to 40 GHz and having at least one or an array of corresponding phase shifter(s) 2112. Embodiments of module 2100 can include any one of the power amplifiers (or power amplifier arrays) 2102, 2104, and/or 2106; any combination of power amplifiers (or power amplifier arrays) 2102, 2104 and/or 2106 or all three power amplifiers (or power amplifier arrays) 2102, 2104, 2106 and corresponding filters and/or phase shifters. Located after power amplifier 2102 is at least one or an array of filter(s) 2104 as shown in FIG. 21. In an alternative embodiment, filter(s) 2104 may be located before power amplifier (or power amplifier array) 2102. Located before power amplifier 2106 is one or an array of phase shifter(s) 2108 and located before power amplifier 2110 is one or an array of phase shifter(s) 2112. In alternative embodiments, either or both of the phase shifters (or phase shifter arrays) 2108 and 2112 may be located after power amplifiers (or power amplifier arrays) 2106, 2110.

In this disclosure, devices that are described as in "communication" with each other or "coupled" to each other need not be in continuous communication with each other or in direct physical contact, unless expressly specified otherwise. On the contrary, such devices need only transmit to each other as necessary or desirable, and may actually refrain from exchanging data most of the time. For example, a machine in communication with or coupled with another machine via the Internet may not transmit data to the other machine for long period of time (e.g. weeks at a time). In addition, devices that are in communication with or coupled with each other may communicate directly or indirectly through one or more intermediaries.

Accompanying each of the embodiments disclosed herein is an associated method. Although process (or method) steps may be described or claimed in a particular sequential order, such processes may be configured to work in different orders. In other words, any sequence or order of steps that may be explicitly described or claimed does not necessarily indicate a requirement that the steps be performed in that order unless specifically indicated. Further, some steps may be performed simultaneously despite being described or implied as occurring non-simultaneously (e.g., because one step is described after the other step) unless specifically indicated. Moreover, the illustration of a process by its depiction in a drawing does not imply that the illustrated process is exclusive of other variations and modifications thereto, does not imply that the illustrated process or any of its steps are necessary to the embodiment(s), and does not imply that the illustrated process is preferred.

Further, the foregoing description and embodiments have been presented for purposes of illustration and description and are not intended to be exhaustive or to limit the embodiments in any sense to the precise form disclosed. Many modifications and variations are possible in light of the above teaching. The embodiments were chosen and described to best explain the principles of the disclosure and its practical application to thereby enable others skilled in the art to best use the various embodiments disclosed herein and with various modifications suited to the particular use contemplated. Also, particular aspects or features of the following disclosure may be described with reference to one or more particular embodiments and/or drawings, it should be understood that such features are not limited to usage in the one or more particular embodiments or drawings with reference to which they are described, unless expressly specified otherwise. The functionality and/or the features of the embodiments that are described may be alternatively embodied by one or more other devices which are described but are not explicitly described as having such functionality/features. The actual scope of the invention is to be defined by the following claims.

The invention claimed is:

1. An integrated module for use in a radio frequency (RF) front end system comprising:
    a first RF signal input to a first switch module including frequencies in the range of 698 to 915 MHz or 1.7 to 2.1 GigaHertz (GHz), wherein the first switch module is connected to a first broadband power amplifier configured to amplify frequencies in the range of 698 to 915 MHz and a second broadband power amplifier configured to amplify frequencies in the range of 1.7 to 2.1 GHz;
    a second switch module connected to the first and second broadband power amplifiers, wherein said second switch module is a multi pole, multi throw switch containing a plurality of switches which are selectively operable to couple the first RF signal input to one of a plurality of transmission paths, each of said transmission paths configured to transmit a plurality of different frequency bands;
    a plurality of filters connected to the outputs of the second switch module and configured to filter transmission path signals;
    a third switch module coupled to the plurality of filters and capable of outputting a plurality of frequencies greater than 698 MHz; and
    a second RF signal input to a third broadband power amplifier which is parallel to the first and second broadband power amplifiers and which operates substantially in the range of 4.9 GHz to 6 GHz.

2. The module of claim 1, wherein the plurality of different frequencies have an upper range of approximately 2.7 GHz.

3. The module of claim 1, further comprising:
    a third RF signal input to a fourth broadband power amplifier which is parallel electrically to the first, second and third broadband power amplifiers and is connected to the second switch module.

4. The module of claim 3 wherein the third RF signal input includes frequencies in the range of approximately 2.3 GHz to 2.7 GHz which are amplified by the fourth broadband power amplifier.

5. The module of claim 3 wherein the third RF signal input includes frequencies in the range of approximately 3.3 GHz to 3.8 GHz which are amplified by the fourth broadband power amplifier.

6. An integrated module for use in a radio frequency (RF) front end system comprising:
a first and second broadband power amplifiers each configured to amplify a first RF signal;
a first switch module connected to the first and second broadband power amplifiers, wherein said first switch module is a multi pole, multi throw switch containing a plurality of switches which are selectively operable to couple the first RF signal to one of a plurality of transmission paths, each of said transmission paths configured to transmit a plurality of different frequency bands; and
a second RF signal input to a first phase shifter coupled to a 28 GigaHertz (GHz) third broadband power amplifier which operates substantially in the range of 27 GHz to 29 GHz to amplify the second RF signal.

7. The module of claim 6, further comprising:
a third RF signal input to a 39 GHz fourth broadband power amplifier which operates substantially in the range of 38 GHz to 40 GHz to amplify the third RF signal.

8. The module of claim 7, further comprising:
a second phase shifter coupled to the 39 GHz power amplifier.

9. The module of claim 8,
wherein the 28 GHz power amplifier and the 39 GHz power amplifier are arranged in parallel electrically to the plurality of broadband power amplifiers.

10. The module of claim 6, wherein the plurality of different frequency bands include bands 38, 40, 41, and 7.

11. The module of claim 6, wherein the plurality of different frequency bands are Long Term Evolution (LTE) frequency bands.

12. The module of claim 8, further comprising:
a fourth RF signal input to a fifth broadband power amplifier which is parallel electrically to the first and second broadband power amplifiers and which operates substantially in the range of 4.9 GHz to 6 GHz.

13. An integrated module for use in a radio frequency (RF) front end system comprising:
a plurality of broadband power amplifiers each configured to amplify a first RF signal;
a first switch module connected to the plurality of broadband power amplifiers, wherein said first switch module is a multi pole, multi throw switch containing a plurality of switches which are selectively operable to couple the RF signal to one of a plurality of transmission paths, each of said transmission paths configured to transmit a plurality of different frequency bands; and
a second RF signal input to a phase shifter coupled to a 39 GigaHertz (GHz) power amplifier which operates substantially in the range of 38 GHz to 40 GHz to amplify the second RF signal.

14. An integrated module for use in a radio frequency (RF) front end system comprising:
a first RF signal input to a first switch module including frequencies in the range of 698 to 915 MHz or 1.7 to 2.1 GigaHertz (GHz), wherein the first switch module is connected to a first broadband power amplifier configured to amplify frequencies in the range of 698 to 915 MHz and a second broadband power amplifier configured to amplify frequencies in the range of 1.7 to 2.1 GHz;
a second switch module connected to the first and second broadband power amplifiers, wherein said second switch module is a multi pole, multi throw switch containing a plurality of switches which are selectively operable to couple the first RF signal input to one of a plurality of transmission paths, each of said transmission paths configured to transmit a plurality of different frequency bands;
a plurality of filters connected to the outputs of the second switch module and configured to filter transmission path signals;
a third switch module coupled to the plurality of filters and capable of outputting frequencies substantially equal to or greater than 698 MHz; and
a second RF signal input to a third broadband power amplifier which is parallel electrically to the first and second broadband power amplifiers and which operates substantially in the range of 27 GHz to 29 GHz or 38 GHz to 40 GHz.

15. An integrated module for use in a radio frequency (RF) front end system comprising:
a first RF signal input to a first switch module which is has two outputs connected to a first broadband power amplifier and a second broadband power amplifier which are configured to amplify the first RF signal input, wherein each of the two outputs of the first switch module transmits a different;
a second RF signal input connected directly to a third broadband power amplifier;
a second switch module connected to the first, second and third broadband power amplifiers, wherein said second switch module is a multi pole, multi throw switch containing a plurality of switches which are selectively operable to couple the first and second RF input signals to one of a plurality of transmission paths, each of said transmission paths configured to transmit a plurality of different frequency bands;
a plurality of filters connected to the outputs of the second switch module;
a third switch module coupled to the plurality of filters and capable of outputting frequencies substantially equal to or greater than 698 MHz; and
a third RF signal input connected to a fourth power amplifier which operates in the range of 4.9 GHz to 6 GHz.

16. The module of claim 15, wherein the plurality of different frequency bands include bands 38, 40, 41, and 7.

17. The module of claim 15, wherein the plurality of different frequency bands are Long Term Evolution (LTE) frequency bands.

18. An integrated module for use in a radio frequency (RF) front end system comprising:
a plurality of broadband power amplifiers each configured to amplify a first RF signal;
a first switch module connected to the plurality of broadband power amplifiers, wherein said first switch module is a multi pole, multi throw switch containing a plurality of switches which are selectively operable to couple the first RF signal to one of a plurality of transmission paths, each of said transmission paths configured to transmit a plurality of different frequency bands; and a second RF signal input to a first phase shifter coupled to a 28 GigaHertz (GHz) power amplifier which operates substantially in the range of 27 GHz to 29 GHz to amplify the second RF signal.

19. The module of claim 18, further comprising:

a third RF signal input to a second phase shifter coupled to a 39 GHz power amplifier which operates substantially in the range of 38 GHz to 40 GHz to amplify the third RF signal.

20. The module of claim 18, wherein the plurality of different frequency bands include bands 38, 40, 41, and 7.

21. The module of claim 18, wherein the plurality of different frequency bands are Long Term Evolution (LTE) frequency bands.

* * * * *